(12) United States Patent
Kitano et al.

(10) Patent No.: US 6,872,256 B2
(45) Date of Patent: *Mar. 29, 2005

(54) FILM FORMING UNIT

(75) Inventors: Takahiro Kitano, Kikuyo-Machi (JP); Masateru Morikawa, Kikuyo-Machi (JP); Yukihiko Esaki, Kikuyo-Machi (JP); Nobukazu Ishizaka, Kikuyo-Machi (JP); Norihisa Koga, Kikuyo-Machi (JP); Kazuhiro Takeshita, Kikuyo-Machi (JP); Hirofumi Ookuma, Kikuyo-Machi (JP); Masami Akimoto, Kikuyo-Machi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/611,991

(22) Filed: Jul. 3, 2003

(65) Prior Publication Data

US 2004/0094089 A1 May 20, 2004

Related U.S. Application Data

(62) Division of application No. 09/736,397, filed on Dec. 15, 2000, now Pat. No. 6,616,760.

(30) Foreign Application Priority Data

Dec. 17, 1999 (JP) ............................................. 11-359081
Dec. 17, 1999 (JP) ............................................. 11-359573

(51) Int. Cl.[7] ............................ B05C 5/00; B05B 15/02
(52) U.S. Cl. ....................... 118/323; 118/692; 118/302; 239/110
(58) Field of Search ................................ 118/302, 323, 118/203, 683, 692, 52, 612; 239/110

(56) References Cited

U.S. PATENT DOCUMENTS

| | | | |
|---|---|---|---|
| 4,671,309 A | 6/1987 | Iemura | |
| 5,134,962 A | 8/1992 | Amada et al. | |
| 5,275,658 A | 1/1994 | Kimura | |
| 5,626,913 A | 5/1997 | Tomoeda et al. | |
| 5,674,051 A | 10/1997 | Maruyama | |
| 5,905,515 A | 5/1999 | Yoshimura | |
| 5,916,368 A | 6/1999 | Ebert | |
| 5,919,520 A | 7/1999 | Tateyama et al. | |
| 5,962,070 A | 10/1999 | Mitsuhashi et al. | |
| 6,248,168 B1 * | 6/2001 | Takeshita et al. | 118/52 |
| 6,383,948 B1 * | 5/2002 | Kitano et al. | 438/758 |
| 6,616,760 B2 * | 9/2003 | Kitano et al. | 118/302 |
| 6,673,155 B2 * | 1/2004 | Nagashima et al. | 118/666 |

* cited by examiner

Primary Examiner—Chris Fiorilla
Assistant Examiner—Yewebdar Tadesse
(74) Attorney, Agent, or Firm—Rader, Fishman & Grauer PLLC

(57) ABSTRACT

The present invention is a film forming unit for discharging a coating solution from a coating solution discharge nozzle toward a substrate to form a layer on a surface of the substrate, which has a supply flow path for supplying a cleaning fluid to a discharge flow path continuing to a discharging port of the coating solution discharge nozzle. When the cleaning fluid is positively supplied directly to the discharge flow path of the coating solution discharge nozzle, the supply pressure of the cleaning fluid as well as the capability of cleaning is added. Therefore, further effective cleaning is attained in compare with the conventional case where a coating solution discharge nozzle is simply dipped into a cleaning fluid. In consequence, even when the discharging port of the nozzle is minute, it is possible to perfectly remove the contamination. This allows the discharge pressure to remain constant so as to form a uniform coating layer on the substrate.

10 Claims, 20 Drawing Sheets

FILM FORMING UNIT

This application is a divisional application of Ser. No. 09/736,397, filed Dec. 15, 2000 now U.S. Pat. No. 6,616,760.

BACKGROUND OF THE INVENTION

1. Field of the Invention

This invention relates to a film forming unit for forming a coating layer on a surface of a substrate.

2. Description of the Related Art

In the process for manufacturing semiconductor devices, for example, the photolithography process including resist coating processing for coating a resist solution on a wafer surface to form a resist layer, exposure processing for exposing to define a pattern on a wafer, developing treatment for developing the wafer having been exposed, and so on is performed with the respective processing devices to form a predetermined circuit pattern on the wafer.

In the above resist coating processing, the resist solution is discharged from a coating solution discharge nozzle toward above of the wafer. The coating solution discharge nozzle is contaminated by the resist solution and the like and thus needed to clean as necessary.

Conventionally, the coating solution discharge nozzle is cleaned with a cleaning fluid of solvent or the like such that a discharging port of the coating solution discharge nozzle is dipped into the solvent stored in a cleaning bath.

However, fine contamination cannot be perfectly removed by simply dipping as in the conventional manner. Furthermore, with recent advances in semiconductor technology, the desire to reduce a hole diameter of the aforementioned discharging port to approximately 200 $\mu$m grows. On such a minute diameter, a high effectiveness of cleaning is not expected from the conventional cleaning method as described above, with the result that minute contaminations may remain on the above discharging port.

If contaminant is adhered even slightly on the discharging port of the coating solution discharge nozzle, a direction or pressure of discharing the resist solution is varied and thus the resist solution is not coated appropriately on the wafer, resulting in a possibility of forming no coating layer having uniform thickness.

Conventionally, as shown in FIG. 21, the resist solution stored in a resist solution reservoir 213 is sent into a flow channel by a press type pump 216 such as a bellows pump, passed through a filter 217 or the like, and then supplied from the above coating solution discharge nozzle 211 onto the surface of a wafer W. In this event, the resist solution 213 for, e.g. five wafers W is stored in the bellows pump 216, and the resist solution 213 for one wafer W is pushed out from the bellows pump 216 to be supplied from the nozzle 211 onto the surface of the wafer W.

The discharge pressure of the coating solution discharge nozzle exerts an influence upon the volume of resist solution supplied onto the wafer W as it is. Hence, in order to insure uniform film-thickness, the discharge pressure for the resist solution is required to keep approximately constant.

In a conventional supply system for the resist solution, when a long time, for example, around one minute is taken for discharge, it is difficult to maintain the discharge pressure at a constant value. This produces variation in the volume of resist solution supplied to the wafer W. As a result, the uniform film-thickness of the resist layer may become worse.

SUMMARY OF THE INVENTION

The present invention has been made in view of the aforementioned points, and it is a first object thereof to perfectly remove contamination adhered on a discharging port of a coating solution discharge nozzle even if the disharging port has a minute hole diameter, in order to form a preferred and uniform film of a coating solution on the surface of substrate. It is a second object of the present invention to form a film of a coating solution having a constant thickness by controlling variation in the volume of processing fluid discharged from a coating solution discharge nozzle onto a substrate.

To attain the first object, according to a first aspect of the present invention, a film forming unit of the present invention is a film forming unit for discharging a coating solution from a coating solution discharge nozzle toward a substrate to form a layer on a surface of the substrate, in which the coating solution discharge nozzle has a supply flow path for supplying a cleaning fluid to a discharge flow path continuing to a discharging port of the coating solution discharge nozzle.

In this way, by positively supplying the cleaning fluid directly to the discharge flow path of the coating solution discharge nozzle, the supply pressure of the cleaning fluid as well as the capability of cleaning is added. Therefore, further effective cleaning is attained in compare with the conventional case where a coating solution discharge nozzle is simply dipped into a cleaning fluid. In consequence, even when the discharging port of the nozzle is minute, it is possible to perfectly remove the contamination. This allows the discharge pressure to remain constant so as to form a uniform coating layer on the substrate.

When a supply port of the supply flow path opens toward the inside of the discharge flow path, the inside of the discharge flow path can be further effectively cleaned. If the discharge flow path has a water repellant finish against the coating solution, this causes hard adhering contamination on the discharge flow path, resulting in reduction in number of cleaning.

In the present invention, a store portion for the coating solution provided in a main body of the coating solution discharge nozzle and continuing to the discharge flow path; and an air-bubble removing apparatus removing air bubbles included in the coating solution and accumulating in an upper portion of the store portion may be provided.

A dissolved gas is typically included in the coating solution flowing in the store portion in some degree. The dissolved gas is vaporized by slight variation in pressure, and air bubbles occurs in the coating solution. If any measures is not taken against the air bubbles, the air bubbles gradually increase and is involved in the coating solution to be discharged from the discharging port, and coated on the substrate. Also, if the air bubbles accumulates in the store portion, the discharge pressure of the coating solution is varied due to compressibility of the air bubble, so that the coating solution is not discharged at a predetermined pressure. By providing the air-bubble removing apparatus, the air bubbles are removed and the above detriments are avoided. The air-bubble removing apparatus can be proposed as, for example, an apparatus capable of sucking air bubbles.

By providing an outlet pipe for letting out the air bubbles in the air-bubble removing apparatus, the above removing of the air bubbles is appropriately carried out. Since the coating solution flowing into the above store portion is sent at a predetermined pressure, the valve provided in the outlet pipe is closed except when the air bubbles are removed in order to have no effect on the discharge pressure of the coating solution. With a detector for detecting the air bubbles accumulating in the upper portion of the store portion, the removing of the air bubbles can be performed only when the air bubbles accumulates by a predetermined amount. The detector can employ a mechanism using variation in transmissivity of light. Also, it is possible to use a detecting member for detecting contamination on the coating solution discharge nozzle as image data.

When a diaphragm type pump for supplying the coating solution to the coating solution discharge nozzle is used, a detector for detecting changes in amount of push-on of the pump; and a cleaning controller for controlling the supply of the cleaning fluid by the supply flow path based on a detected result of the detection mechanism, may be provided. When the amount of push-on of the diaphragm type pump changes and the change is detected, based on the detected result, for example, the supply flow path is controlled when the detected value reaches a predetermined value, and after the coating solution discharge nozzle is moved to a predetermined position, the supply of the cleaning fluid to the nozzle is started. As a result, since the cleaning of the coating solution discharge nozzle can be performed only when the discharging port is contaminated, unnecessary extra cleaning works can be omitted. When a rotary type pump driven by electric power is used, a detector for detecting changes in rotation frequency or changes in electric power consumption of the pump can be employ.

To attain the second object of the present invention, according to a second aspect of the present invention, a film forming unit of the present invention includes: a press type pump including a pump body for sending the coating solution to the coating solution discharge nozzle, and a press member for pressing the pump body, the coating solution being sent into the pump body from the upstream by pulling the press member, the coating solution being sent from the pump body toward the downstream by pressing the press member, the amount of coating solution sent toward the downstream being adjusted by the amount of press of the press member; a pressure detector for detecting pressure in a flow path for the coating solution between the press type pump and the coating solution discharge nozzle; and a controller for controlling the amount of press of the press member of the press type pump based on a detected value from the pressure detector, in which the amount of press of the press member of the press type pump is controlled based on the pressure in the flow path for the coating solution between the press type pump and the coating solution discharge nozzle, to control the amount of discharge of the coating solution to be supplied from the coating solution discharge nozzle toward the surface of the substrate.

In the present invention, based on the pressure in the flow path of the processing fluid located between the press type pump and the discharge nozzle, the amount of press of the press member of the press type pump is controlled to allow the discharge pressure of the processing fluid to be supplied from the discharge nozzle toward the surface of the substrate to become constant. Therefore, the amount of discharge of the processing fluid remains invariant during the processing, resulting in forming a solution layer having a stable film thickness.

According to a third aspect of the present invention, a film forming unit of the present invention includes: a displacement gauge for detecting the amount of press of the press member of the press type pump; and a controller for controlling operation of an alarm generating portion based on a detected value from the displacement gauge, in which the alarm generating portion is operated when the amount of press of the press member of the press type pump goes out of a preset reference range. In this case, irregularities such as clogging of the discharge nozzle can be detected at an early stage, and it is possible to take an appropriate action. Hence, reset time period until forming of a stable solution layer restart is decreased.

According to a fourth aspect of the present invention, a film forming unit of the present invention includes: a displacement gauge for detecting the amount of press of the press member of the press type pump; a cleaning portion for cleaning the coating solution discharge nozzle; a drive mechanism for moving the coating solution discharge nozzle to the cleaning portion; and a controller for controlling operation of the drive mechanism based on a detected value from the displacement gauge, in which the coating solution discharge nozzle being moved to the cleaning portion by the drive mechanism for cleaning of the coating solution discharge nozzle when the amount of press of the press member of the press type pump goes out of a preset reference range. In this case, when the irregularity such as the clogging of the discharge occurs, the discharge nozzle can be quickly cleaned without putting any burden on an operator.

According to a fifth aspect of the present invention, a film forming unit of the present invention includes the coating solution discharge nozzle having a flow path for the coating solution; a discharging port connected to the flow path for the coating solution for discharging the coating solution in a line form having a very small diameter; and a filter provided to cross the flow path for the coating solution for removing air bubbles from the coating solution. In this case, variation in discharge pressure of the processing fluid which is caused by the presence of air bubbles included in the processing fluid, and the like are suppressed. This allows the stable supply of the processing fluid for the substrate, resulting in improving uniformity of a film thickness of a solution layer. In this point, it is desirable that the filter is made of a porous resin.

DETAILED DESCRIPTION OF THE PREFERRED EMBODIMENT

Figure 1:
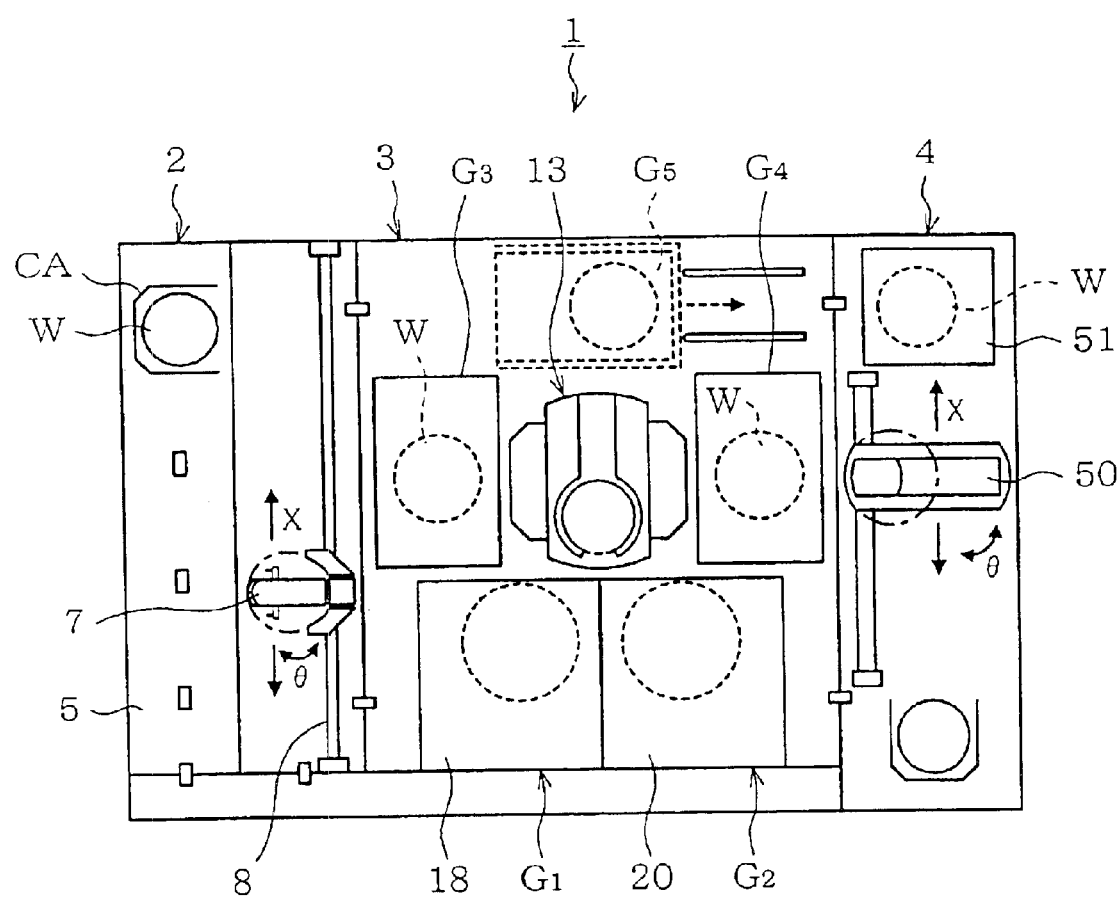
FIG. 1 is a plane view illustrating external of a coating and developing system having a film forming unit according to an embodiment of the present invention.
Figure 2:
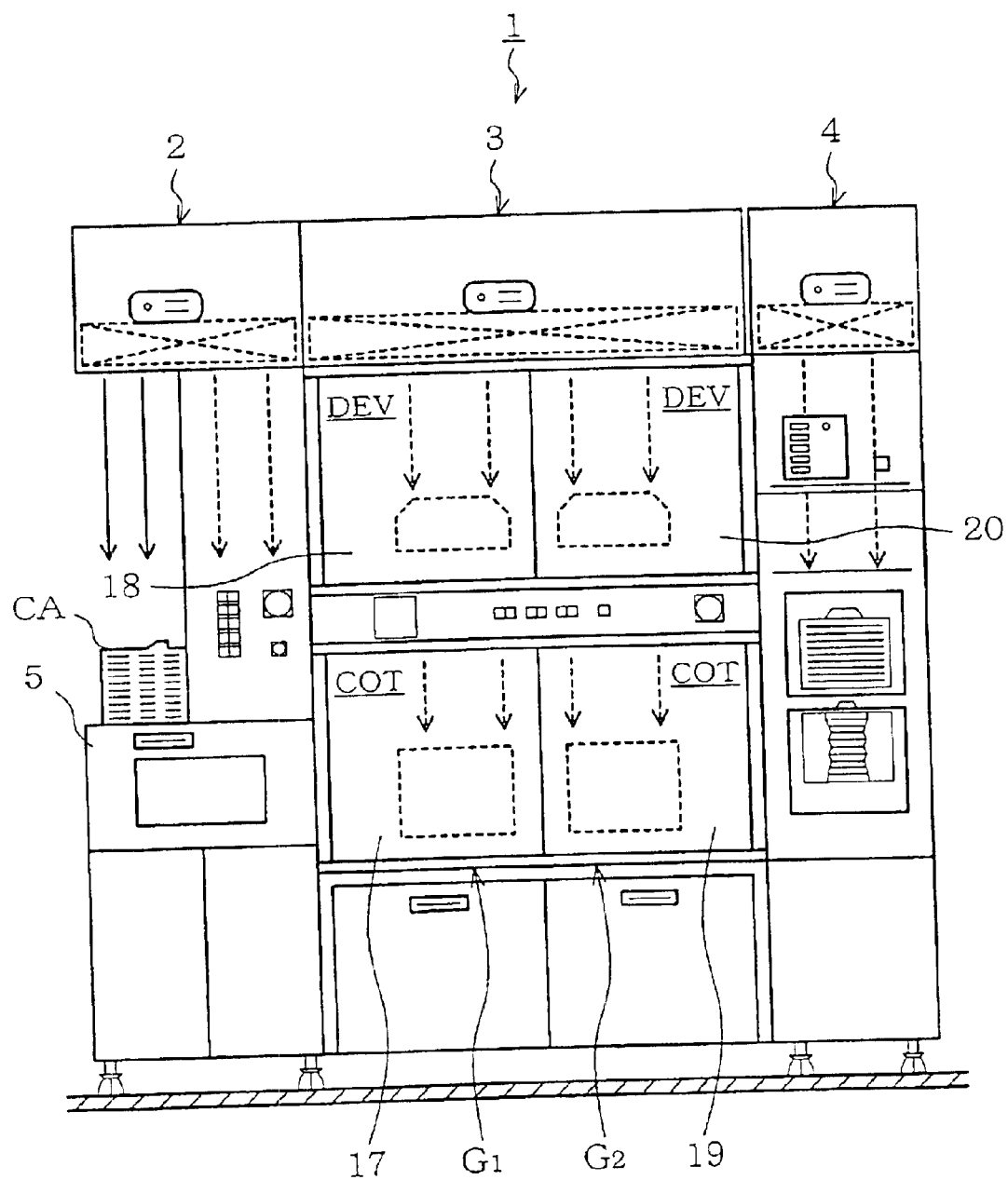
FIG. 2 is a front view of the coating and developing system in FIG. 1.
Figure 3:
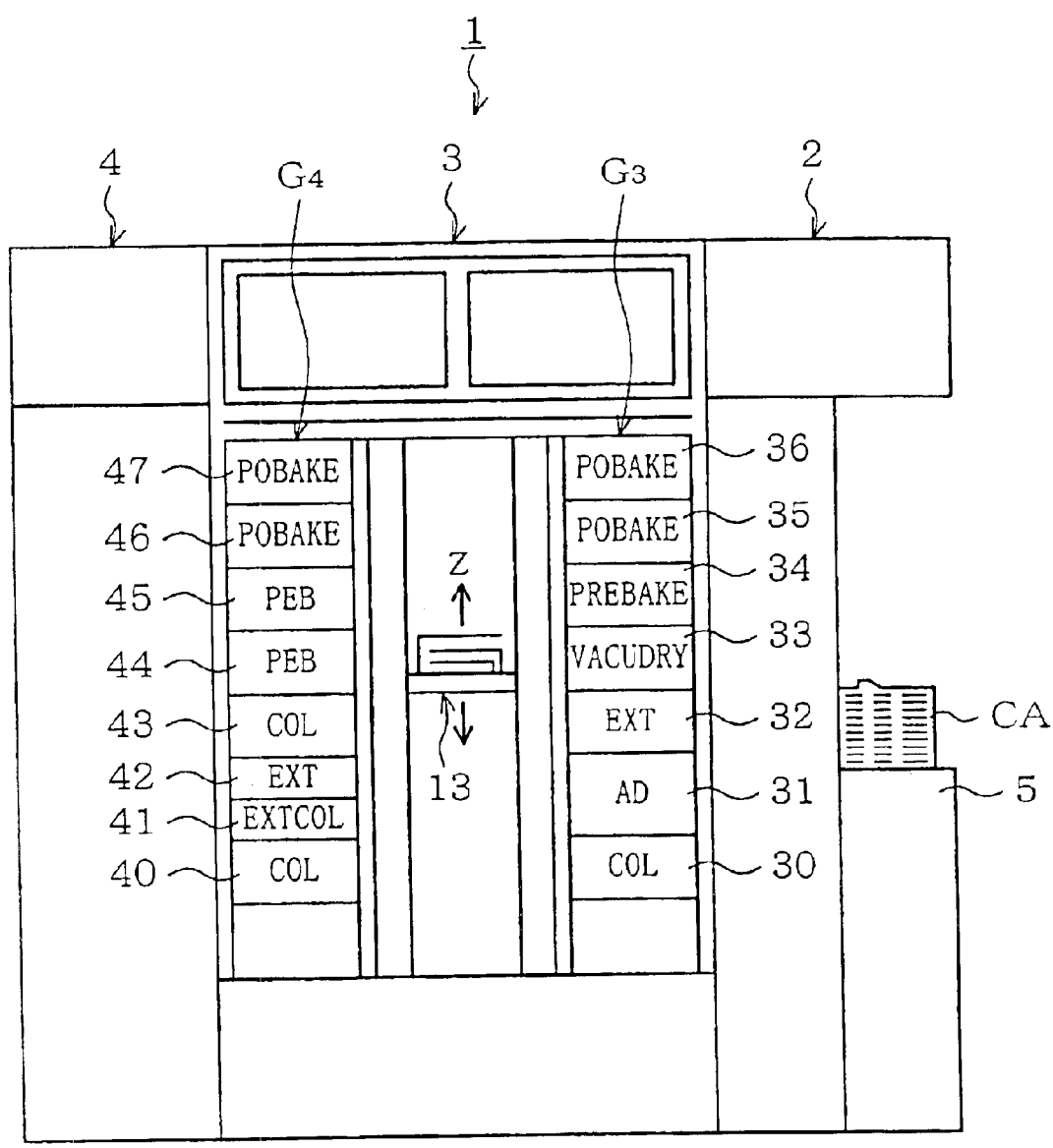
FIG. 3 is a back view of the coating and developing system in FIG. 1.

Preferred embodiments of the present invention will be below described. FIG. 1 is a plane view of a coating and developing system 1 having a resist coating unit according to the embodiment. FIG. 2 is a front view of the coating and developing system 1, and FIG. 3 is a back view of the coating and developing system 1.

As shown in FIG. 1, the coating and developing system 1 has a configuration of integral connection of a cassette station 2 for carrying wafers W, for example, 25 wafers W in cassette between an outside source and the coating and developing system 1 and carrying the wafer W into and from a cassette CA; a processing station 3 consisting of a multistage arrangement of various processing units respectively providing predetermined processings in sheet form in the coating and developing process; and an interface section 4 taking in/taking out the wafer from a not shown aligner arranged next to the processing station 3.

In the cassette station 2, a plurality of cassettes C are removably placed and hold in a line in a direction X (in the top-and-bottom direction of FIG. 1) at a predetermined position of a cassette rest 5 which is a rest portion. A wafer carrier 7 conveyable in the cassette aligning direction (the direction X) and a wafer aligning direction (a direction Z; a vertical direction) of the wafers W housed in the cassette CA, is provided to move along a carrier guide 8 to selectively access each cassette CA.

The wafer carrier 7 includes an alignment function for aligning the wafers W. The wafer carrier 7 is designed to access an extension unit 32 belonging to a third group G3 of processing units in the processing station 3 as described later.

In the processing station 3, a main carrying unit 13 is provided in the central portion thereof. Various processing units are arranged in multistage around the main carrying unit 13 to form a processing unit group. In the coating and developing system 1, four processing unit groups G1, G2, G3 and G4 are arranged. The first and second processing unit groups G1 and G2 are placed on the front side of the coating and developing system 1. The third processing unit group G3 is placed next to the cassette station 2. The fourth processing unit group G4 is placed next to the interface section 4. A fifth processing unit group G5, indicated with the broken line, may be additionally placed as an option on the back side. The aforementioned main carrying unit 13 can take in/take out the wafers W from various processing units, described later, arranged in the processing unit groups G1 to G5.

In the first processing unit group G1, for example, as shown in FIG. 2, a resist coating unit 17 according to the embodiment and a developing unit 18 for supplying a developing solution on the wafer W for treatment are arranged in the two stages from the bottom in order. Similarly, a resist coating unit 19 and a developing unit 20 are superposed in the two stages from the bottom in order in the second processing unit group G2.

In the third processing unit group G3, for example, as shown in FIG. 3, a cooling unit 30 for cooling the wafer W; an adhesion unit 31 for improving the adhesion of the resist solution to the wafer W; the extension unit 32 for making the wafer W wait; a vacuum drying unit 33 for drying solvent in the resist solution; a pre-baking unit 34; postbaking unit 35, 36 for providing a heat treatment after the developing treatment; and so on, are superposed in, for example, the seven stages from the bottom in order.

In the fourth processing unit group G4, for example, a cooling unit 40; an extension cooling unit 41 for air-cooling the wafer W placed therein; an extension unit 42; a cooling unit 43; post-exposure baking units 44, 45 providing a heat treatment after a developing treatment; postbaking units 46, 47; and so on are superposed in, for example, the eight stages from the bottom in order.

A wafer carrier 50 is provided in the central portion of an interface section 4. The wafer carrier 50 is designed to be movable in the direction X (the top-and-bottom direction in FIG. 1) and the direction Z (the vertical direction) and rotatable in a direction θ (a rotation direction about the Z axis), and also to access the extension cooling unit 41 belonging to the fourth processing unit group G4, the extension unit 42 belonging to the fourth processing unit group G4, a peripheral aligner 51, and a not shown aligner.

Next, explaining configuration of the aforementioned resist coating unit 17, a resist coating unit employed here is capable of carrying out a coating scheme with the knack of so-called the drawing in one stroke of a pen, in which resist solution discharge means for discharging the resist solution coats the wafer W with the resist solution while moving relatively to the wafer W.

Figure 4:
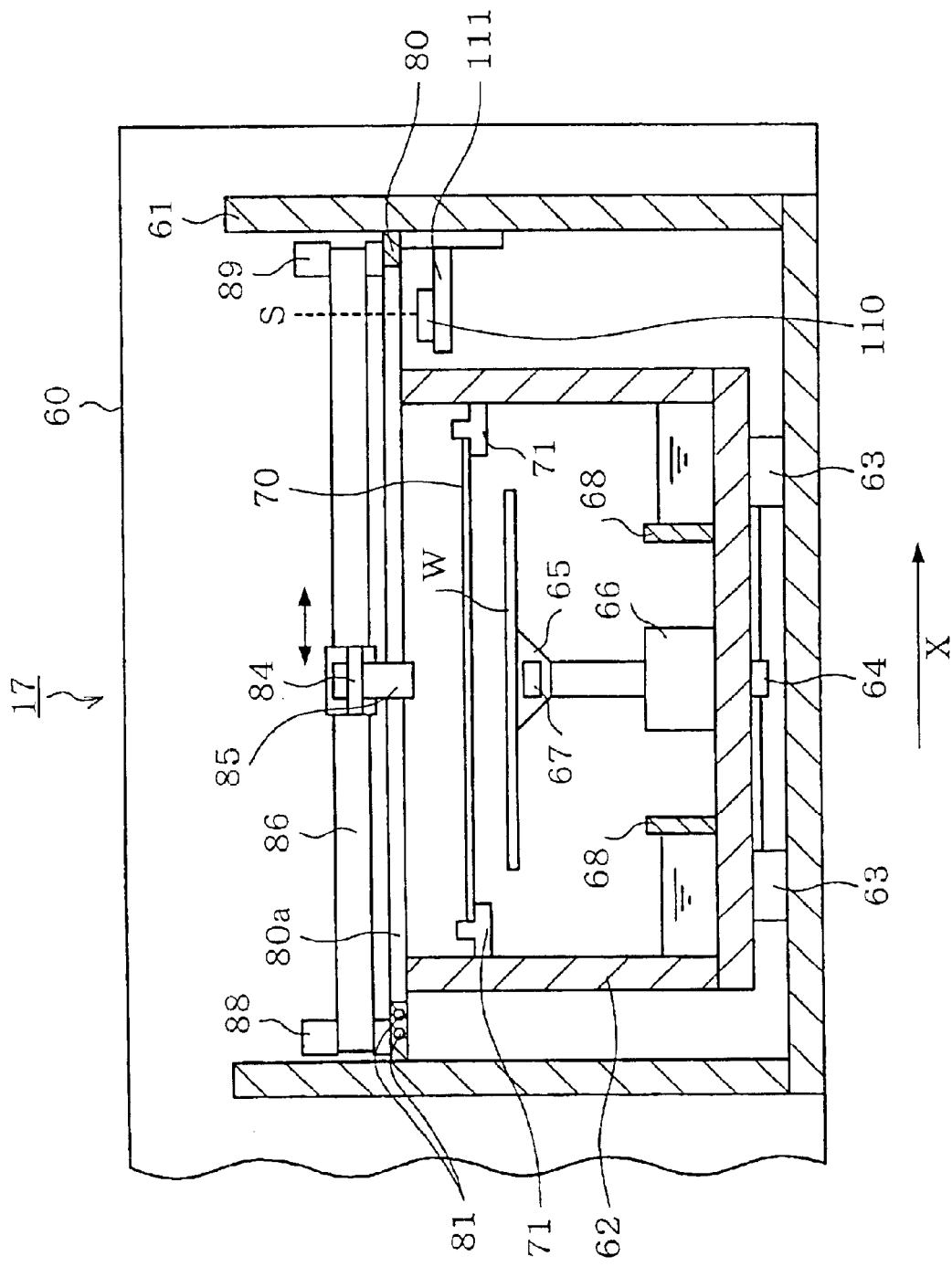
FIG. 4 is an explanatory view of a vertical section of a resist coating unit according to an embodiment.
Figure 5:
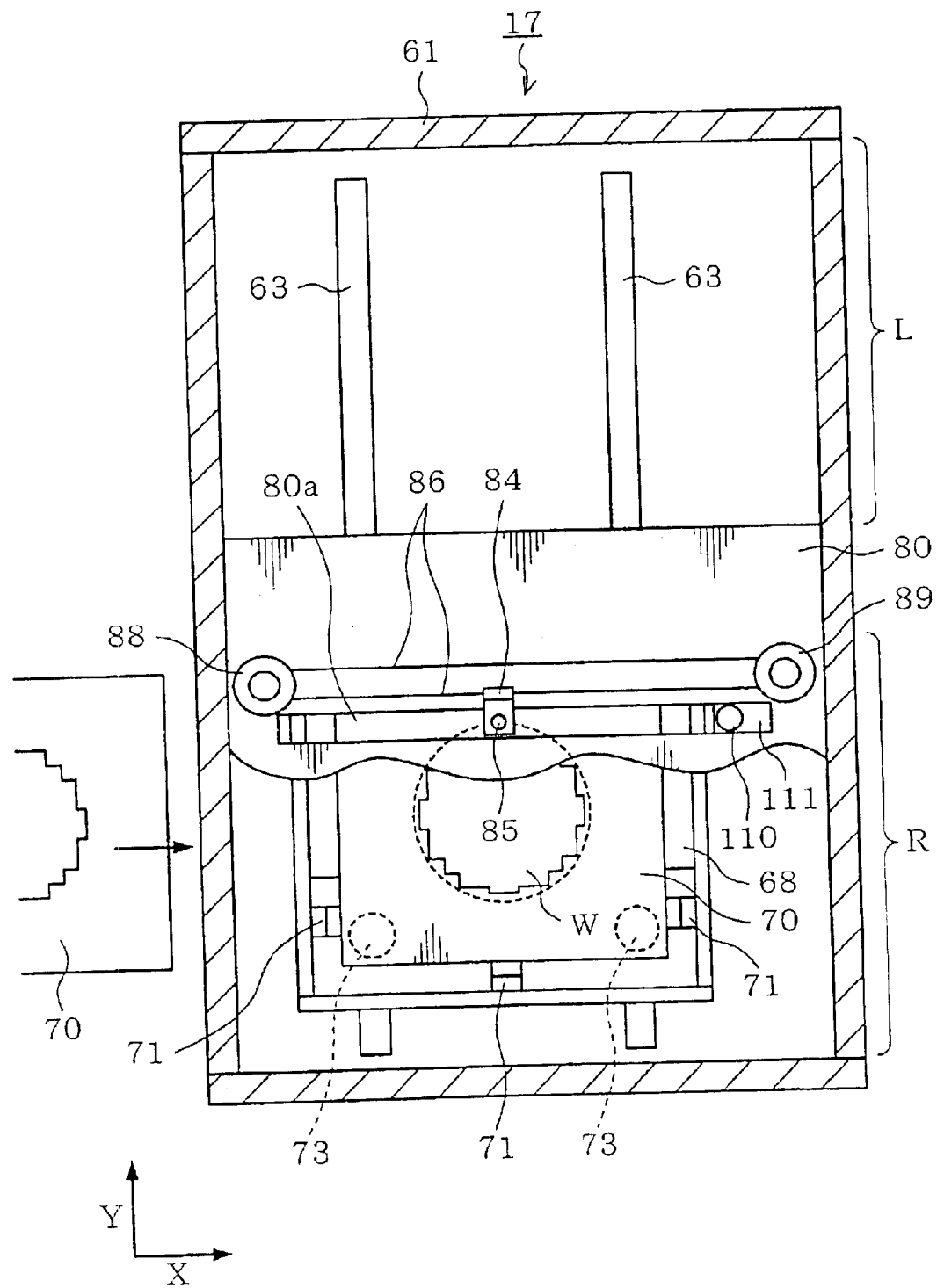
FIG. 5 is an explanatory view of a cross section of the resist coating unit according to the embodiment.

As shown in FIG. 4 and FIG. 5, in a casing 60 of the resist coating unit 17, an approximate box-shaped outer container 61 is provided to elongate in a direction Y (the top-and-bottom direction in FIG. 5), and has an opened top face. In the outer container 61, an inner container 62 in which the wafer W is treated is provided. The inner container 62 has an opened top face, and is designed to be moved on two rails 63, provided on the bottom face of the outer container 61 to extend in the direction Y, by an inner container drive mechanism 64. Thus, when the wafer W is delivered to or from the inner container 62, the inner container 62 moves to a carry zone L on the positive direction side (upward in FIG. 5) of the direction Y of the outer container 61. When the wafer W undergoes the coating processing, the inner container 62 moves to a processing zone R on the negative direction side (downward in FIG. 5) of the direction Y It is also possible to move the inner container 62 in the direction Y by a predetermined distance at predetermined timing while the resist solution is coated on the wafer W.

In the inner container 62, a rest 65 is provided to adsorb and hold the wafer W. Under the rest 65, a rotation drive 66 is provided for rotating the rest 65. In the rest 65, ultrasonic vibrator 67 is mounted in to vibrate the rest 65 at high frequency. On the bottom face of the inner container 62, a solvent tank 68 storing the solvent for maintaining the inside of the inner container 62 in a solvent atmosphere of a predetermined concentration is provided.

On the bottom face of the inner container 62, an exhaust port 73 is provided. Exhausting through the exhaust port 73 produces air stream in the inner container 62, so that a predetermined concentration of solvent on the periphery of the wafer W is maintained.

In addition, a mask member 70 for covering the wafer W to limit a range of coating the resist solution thereon is arranged above the wafer W. The mask member 70 is supported by a mask supporting member 71 provided on an inner wall of the inner container 62. The mask member 70 can be carried in the direction X by a not shown carry mechanism. Therefore, after the mask member 70 is moved to a cleaning zone on the negative direction side (on the left side of FIG. 5) of the direction X of the outer container 61 for waiting therein, and the inner container 62 loading the wafer W is moved to the processing zone R, the above carry mechanism moves the mask member 70 onto the mask supporting member 71 in the inner container 62 such that the mask supporting member 71 supports the mask member 70.

To the outer container 61, a lid body 80 is mounted to cover the processing zone R of the outer container 61. When the inner container 62 moves to the processing zone R, the lid body 80 covers the top of the inner container 62. This aids maintenance of the predetermined atmosphere in the inner container 62. A thermally adjustable heater 81 is incorporated in the lid body 80 to prevent the solvent in the solvent tank 68 from causing occurrence of sweating on the underside of the lid body 80. The lid body 80 is provided with a slit 80a extending in the direction X. The slit 80a is formed such that a below-explained discharge nozzle 85 as the coating solution discharge nozzle moves within the range of the slit 80a, which is fundamentally enough if the slit 80a is opened within a moving range required in order that the discharge nozzle 85 supplys the resist solution on the wafer W, i.e, from an end to the other end of the diameter of the wafer W. In the embodiment, however, a receive container 110 for receiving a cleaning fluid when the discharge nozzle 85 is cleaned which will be explained later, is provided outward the positive direction of the direction X of the inner container 62. Therefore, the length of the slit 80a is extended in the positive direction of the direction X to allow the discharge nozzle 85 to move to the cleaning position S.

In the slit 80a of the lid body 80 as described above, the discharge nozzle 85 discharging the resist solution is arranged to be able to discharge the resist solution toward the wafer W placed thereunder. As shown in FIGS. 4, 5, the discharge nozzle 85 is secured in a holder 84 mounted on a timing belt 86 extending in the direction X. The timing belt 86 is wound on pulleys 88, 89 provided on the lid body 80. The pulley 88 is rotated in the normal and reverse directions by a not shown rotation mechanism such as a motor. As a result, with the movement of the timing belt 86, the discharge nozzle can be reciprocated in the slit 80a of the lid body 80. Thus, the discharge nozzle 85 discharges the resist solution while moving relatively to the wafer W placed under the nozzle 85, and further the inner container 62 moves intermittently in the direction Y. This allows the resist solution to be discharged toward the entire surface of the wafer W in the knack of so-called the drawing in one stroke of a pen. When the discharge nozzle 85 is cleaned, the discharge nozzle 85 can be moved to the aforementioned cleaning position S outside the inner container 62.

The receive container 110 is situated under the cleaning position S for the discharge nozzle 85 to receive the cleaning fluid dripping in cleaning the discharge nozzle 85. The receive container 110 is supported by a supporter 111 which is secured at a predetermined position on the inner wall of the outer container 61.

Next, the aforementioned discharge nozzle 85 discharging the resist solution toward above of the wafer W will be further explained with reference to FIG. 6. A main body 90 of the discharge nozzle 85 is formed to have an approximate cylinder-like external shape and provided therein with a store portion 90a into which the resist solution supplied into the discharge nozzle 85 flows.

A top end of the main body 90 is opened and arranged with a lid member 91 for closing the top end. The lid member 91 is provided with a coating solution supply pipe 92 for allowing the resist solution to flow from a not shown coating solution supply source into the store portion 90a under a predetermined pressure. On the other hand, in a lower end of the main body 90, a discharging port 90b having a predetermined diameter and discharging the resist solution from the store portion 90, and a discharge flow path 90c communicating with the discharging port 90b, are provided. The discharging port 90b and the discharge flow path 90c have water repellent finish against the resist solution used. For example, a fluorine plastic is coated for the water repellent finish. Hence, the resist solution flows from the coating solution supply pipe 92 arranged in the upper portion, into the store portion 90a, then establishes stability of the pressure in the store portion 90a, and then is discharged toward above of the wafer W from the discharging port 90b arranged in the lower portion.

The discharge flow path 90c of the main body 90 is provided with a opened supply port 93 for supplying the cleaning fluid to the discharging port 90b in cleaning, and the supply port 93 communicates with a supply flow path 94 for the cleaning fluid provided in the main body 90. The supply flow path 94 is inclined downward to inject the cleaning fluid diagonally downward from the supply port 93. Hence, the cleaning fluid supplied from the not shown cleaning fluid supply source passes through the supply flow pant 94 in the main body 90, and is injected from the supply port 93 to clean the discharging port 90b.

The aforementioned lid member 91 is provided with an outlet pipe 96 for letting out air-bubbles accumulated in the upper portion of the store portion 90a, and a valve 97 is mounted in the outlet pipe 96. A check portion K for the outlet pipe 96 is provided at a predetermined position between the valve 97 and the lid member 91 and is transparent to allow light to pass therethrough. An emitter 100 as a light emitting unit of a detecting device and a photosensor 101 as a light receiving unit are provided to face toward each other with the check portion K in between.

The emitter 100 emits light and the photosensor 101 receives the light passing through the check portion K in the outlet pipe 96, to measure a change in transmissivity of the passed light. The outlet pipe 96 communicates with a suction apparatus 102. The photosensor 101 applies the measured vale to a controller 99. When the measure value exceeds a threshold value, the controller 99 actuates the suction apparatus 102, and opens the valve 97. Therefore, for example, when air bubbles flow from the upper portion of the store portion 90a into the outlet pipe 96 and the check portion K becomes full of the air bubbles, the photosensor 101 detects changes of transmissivity of the light and the controller 99 opens the valve 97 to allow the suction apparatus 102 to remove the air bubbles.

Next, operation of the resist coating unit 17 configured as described above will be described in conjunction with steps in the photolithography process performed in the coating and developing system 1.

First, the wafer carrier 7 unloads a unprocessed wafer W from the cassette CA, and loads it in the adhesion unit 31 belonging to the third processing unit group. The wafer W after being coated with, for example, HMDS for improving the adhesion of the resist solution, is carried to the cleaning unit 30 by the main carrier 13 to be cooled to a predetermined temperature. Thereafter, the wafer W is carried to the resist coating unit 17 or 19.

In the resist coating unit 17 or 19, the wafer W is coated with the resist solution in the knack of so-called the drawing in one stroke of a pen. Thereafter, the main carrier carries the wafer W to the vacuum drying unit 33, a pre-baking unit 34 and the cleaning unit 40 in sequence. After that, the wafer W undergoes a sequence of predetermined processings such as exposure processing, developing treatment and so on in the respecive processing units and the coating and developing treatment finishes.

Detailing operation in the above resist coating unit 17, first, the wafer W after being cooled to a predetermined temperature in the cooling unit 30, is carried into the casing 60 in the resist coating unit 17 by the main carrier 13. At this time, the inner container 62 in the outer container 61 already waits in the carry position L. The wafer W is placed directly on the rest 65 by the main carrier 13 and adsorbed and held. Here, the wafer W is aligned at a predetermined position by the rotation mechanism 66. The inner container 62 is then moved to the processing position R by the inner container drive mechanism 64. The mask 70 waiting in the cleaning portion is then moved from outside of the outer container 61 to inside of the inner container by the not shown carry mechanism to be placed on the mask support member 71.

Next, gas in the inner container 62 is discharged from the exhaust port 73 at predetermined speed to maintain the inside of the inner container 62 in the predetermined atmosphere. In the inner container 62, then, while the discharge nozzle 85 moves relatively to the wafer W, the resist solution is coated to form a resist layer on the wafer W.

Figure 7:
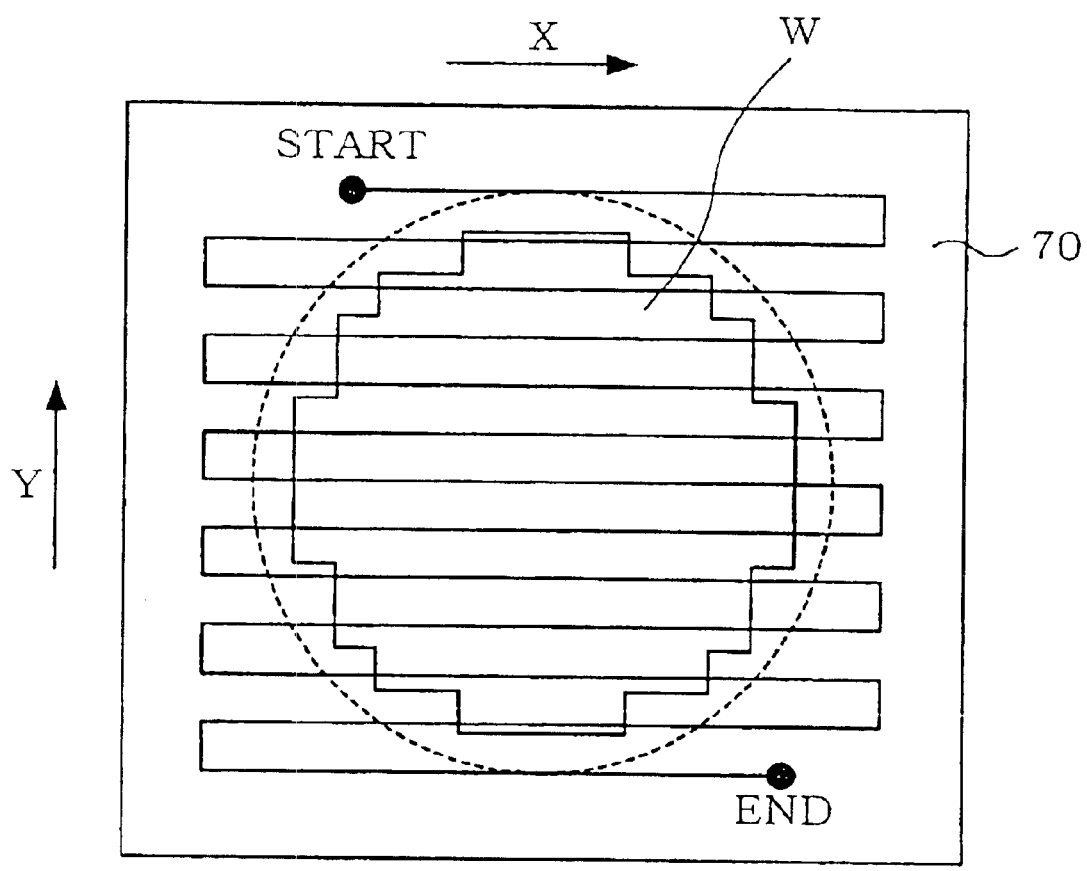
FIG. 7 is an explanatory view illustrating a coating path of a resist solution according to the embodiment.

FIG. 7 shows an example of a coating path of a resist solution. For example, as shown in FIG. 7, while the discharge nozzle 13 first moves from a position START in the positive direction of the direction X (the right direction of FIG. 7) at predetermined speed, the resist solution is discharged toward above of the wafer W. At this time, in the discharge nozzle 13, the resist solution sent from the not shown resist solution supply source under predetermined pressure, flows from the coating solution supply pipe 92 to the store portion 90a, then establish stability for the pressure in the store portion 90a, then passes through the discharge flow path 90c arranged in the lower portion of the store portion 90a to be discharged from the discharging port 90b.

After that, the discharge nozzle 85 advances for a distance longer than a diameter of the wafer W, namely, to a position outside the edge of the wafer W at all time, and makes a stop on the mask member 70. All this while, the resist solution is being discharged, and the resist solution discharged to any position out of the wafer W is received by the mask member 70 to be drained. The inner container 62 is then moved in the direction Y for a predetermined distance by the inner container drive mechanism 64, and the wafer W also moves in the direction Y. Thereafter, the discharge nozzle 85 returns and moves in the negative direction of the direction X while continuously coating the resist solution, and similarly, advances to the outside of the wafer W and makes a stop. The wafer W moves for a predetermined distance in the direction Y, and again, the discharge nozzle 85 returns and continuously coats the resist solution on the wafer W.

The above steps are repeated, and when the discharge nozzle 85 reaches a position END shown in FIG. 7, the discharge nozzle 85 stops the discharging and the coating finishes. As a result, the discharge nozzle 85 describes a track as shown in FIG. 7, and thus the resist solution is coated on the entire surface of the wafer W in the manner of so-called the drawing in one stroke of a pen. After that, the high frequency vibrator 67 mounted in the rest 65 vibrates the wafer W to flat the resist solution on the wafer W. Finally, the resist solution is evenly coated on the coating range on the wafer W, resulting in uniformly forming a resist layer having a predetermined film thickness on the wafer W.

After coating the resist solution, the mask member 70 is moved out from the outer container 61 by the not shown carry mechanism. The inner container 62 is then moved to the carry portion L by the inner container drive mechanism 64. The main carrier 13 unloads the wafer W form the casing 60 and carry it to the vacuum drying unit 33 for the next processing.

The aforementioned coating processing is continuously carried out for each wafer W. Every after the coating processing for the single wafer W finishes, as explained above, the emitter 100 and the photosensor 101 provided in the outlet pipe 96 extending from the discharge nozzle 85, checks the amount of air bubbles of the vaporized coating solution in the store portion 90a.

Figure 8:
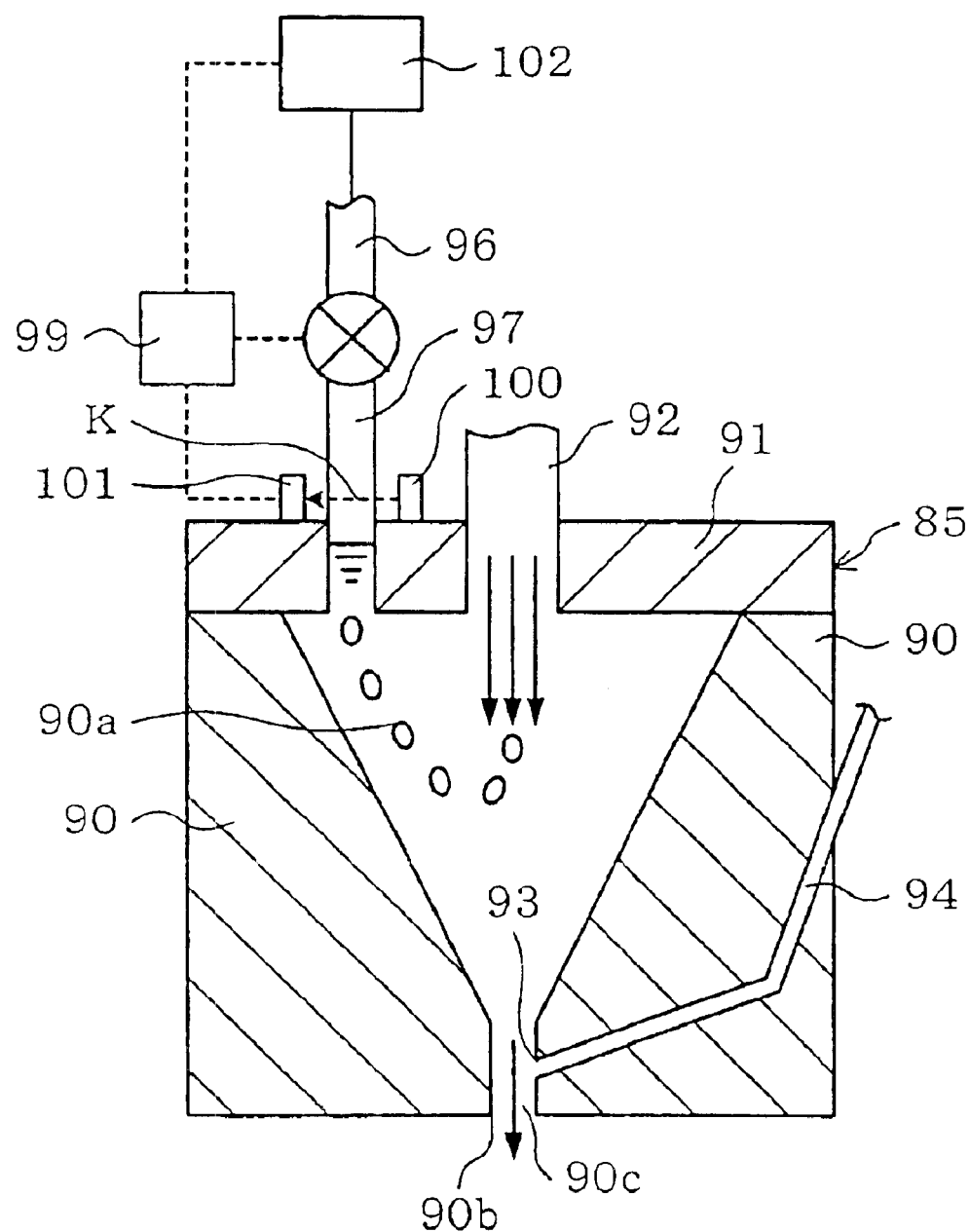
FIG. 8 is an explanatory diagram illustrating a state of air bubbles evolved from a coating solution in the discharge nozzle and remaining in an outlet pipe.

After the aforementioned coating processing finishes, first, the supplying of the resist solution to the discharge nozzle 85 is stopped. Then, the emitter 100 and the photosensor 101 detect whether or not the check portion K in the outlet pipe 96 is full of air bubbles. As shown in FIG. 8, the air bubbles result from the vaporization in the store portion 90a while the resist solution is discharged from the discharge nozzle 85, then make an ascent toward the upper portion of the store portion 90a, and then flow into the outlet pipe 96 which has been full of the resist solution in advance. Then, the air bubbles are gradually accumulated in the outlet pipe 96 closed by the valve 97. The gas space formed by the accumulation gradually increases. When the increased gas space reaches the check portion K provided at the predetermined position, the aforementioned photosensor 101 detects changes of transmissivity of the passed light in the check portion K.

When the controller 99 recognizes from the measured value of the photosensor 101 that the check portion K is full of the air bubbles, the controller 99 sends actuate signals to the valve 97 and the suction apparatus 102. This opens the valve 97 and allows the suction apparatus 102 to remove the air bubbles accumulated in the outlet pipe 96 and the store portion 90a. After removing, the valve 97 is closed and the suction apparatus 102 is stopped. It should be noted that, at this time, the resist solution is sucked up from the interior of the store portion 90a into the check portion K, so that the check portion K is full of the resist solution again. Such checking may be performed for each processing for each wafer W or each lot unit of wafers W. Alternatively monitoring is performed at all times and the above removing service is performed before next coating processing if necessary. When recognized that the check portion K is full of air bubbles, nothing is performed and the processing starts for the next wafer W.

The discharge nozzle 85 used in the aforementioned coating processing, is cleaned once every a predetermined number of processed wafers W, for each recipe, or at predetermined periods of time. The following is explanation for the cleaning process.

First, the discharge nozzle 85 after the coating processing for the wafer W shown in FIG. 4, is moved to the cleaning position S, or above of the receive container 110 by the timing belt 86 for waiting while being held by the holder 84.

Figure 6:
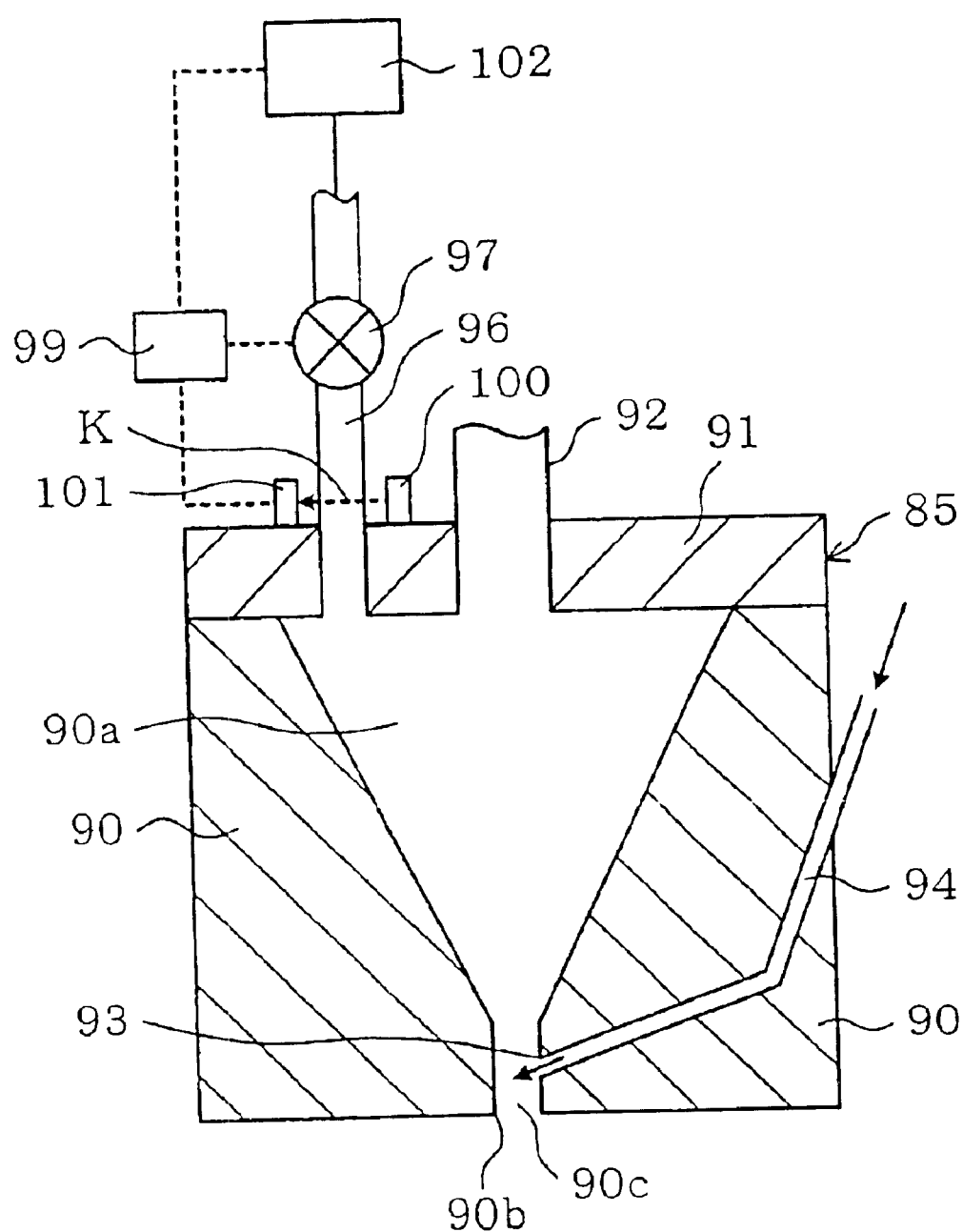
FIG. 6 is an explanatory view illustrating a vertical end of a discharge nozzle used in the resist coating unit.

As shown in FIG. 6, then, the cleaning fluid is supplied from the not shown cleaning fluid supply source to the supply flow path 94 provided in the main body 90 of the discharge nozzle 85. The cleaning fluid passes through the supply flow path 94, then is injected from the supply port 93 opened on the discharge flow path 90c, and then flows in the discharge flow path 90c to clean the discharging port 90b. At this time, the cleaning fluid dropping downward from the discharging port 90b is received by the receive container 110 to prevent contamination with the cleaning fluid.

After the cleaning fluid is supplied for a predetermined period of time, the supplying of the cleaning fluid is stopped. The resist solution is dummy-dispensed from the discharging port 90b, and a sequence of cleaning processes finishes.

According to the foregoing embodiment, since the supply port 93 for the cleaning fluid is opened toward the discharge flow path 90c to allow the cleaning fluid to be injected directly toward the discharging port 90b, it is possible to further completely remove contamination settled on the discharging port 90b. It should be noted that the supply port 93 may be provided in plural to increase the volume of cleaning fluid supplied and enhance detergency.

The provision of the supply flow path 94, continuing to the above supply port 93, in the main body 90, allows a mechanism for supplying the cleaning fluid to be simple. However, an additional supply pipe for supplying a cleaning fluid may be provided. Even in this case, it is possible to successfully clean the discharge port 94 in comparison with prior art. Moreover, the inclined supply flow path 94 allows the cleaning fluid to be injected toward the discharging port 90b without loss of the pressure of supply for the cleaning fluid.

The outlet pipe 96 for removing air bubbles resulting from the vaporization in the store portion 90a during the resist coating prevents failed formation of the predetermined resist layer by coating the resist solution together with the vaporized air bubbles on the wafer W. Since the emitter 100 and the photosensor 101 detect the presence of air bubbles, it is possible to remove the air bubbles as necessary. In stead of use of the above, so-called, light transmission sensor to detect the presence of the air bubbles in the check portion K, a water-level detection sensor or any sensor capable of detecting the presence of air bubbles from a difference between physical properties of gas and liquid may be used.

Since the suction apparatus 102 removes the air bubbles accumulated in the outlet pipe 96 and the store portion 90a, the air bubbles are positively and efficiently removed. However, the air bubbles may be removed by another method, for example, the pressure in the store portion 90a may be increased at predetermined timings to push out the air bubbles.

The cleaning in the foregoing embodiment is performed at the preset timings, e.g., every some wafers W or at predetermined period of time, but the cleaning may be performed only when the discharging port 90b of the discharge nozzle 85 is contaminated. The following is the explanation for a device for detecting that the discharging port 90b.

Figure 9:
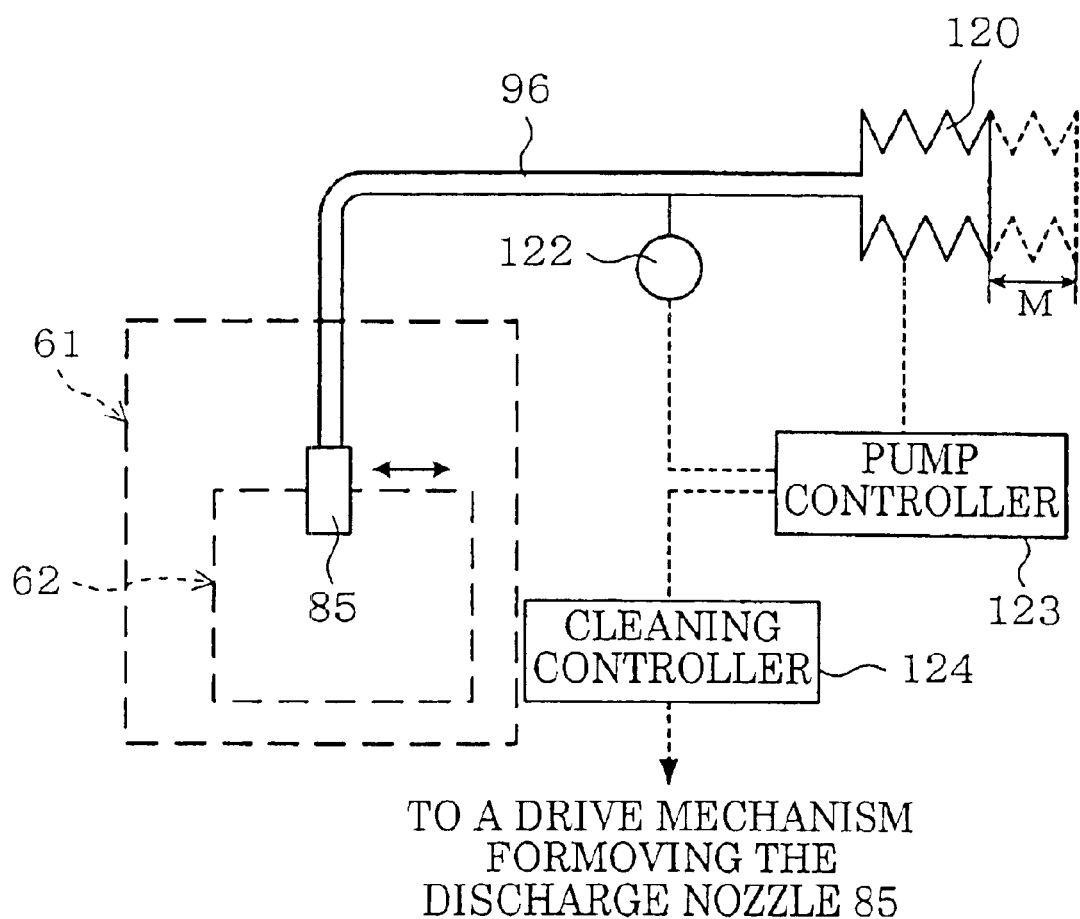
FIG. 9 is a schematically explanatory diagram illustrating a resist solution supply mechanism when the resist solution is supplied to the discharge nozzle using a diaphragm type pump

As shown in FIG. 9, a diaphragm type pump 120 is used as supply means for supplying the resist solution for the discharge nozzle 85. A pressure gage 122 measuring discharge pressure is provided in the coating solution supply pipe 92 extending to the discharge nozzle 85. A pump controller 123 is provided to control the pump 120 based on measured values of the pressure gage 122. The pump controller 123 controls the pump 120 to maintain the discharge pressure of the resist solution at a constant value at all times. Since the pump 120 is a diaphragm type, the amount of push-on M of the pump 120 is changed in accordance with the measured values of the pressure so as to maintain the discharge pressure of the resist solution at a constant value. A cleaning controller 124 is mounted for providing an instruction for starting of cleaning to the supply flow path 94 and a drive mechanism of the discharge nozzle 85, as a trigger when the discharging port 90b is contaminated and the amount of push-on M is changed exceeding a predetermined value.

The above pump controller 123 stores properties of various types of resist solutions, for example, the amount of push-on M of the pump 120 to a degree of viscosity, and a detection function as detection means for calculating the amount of changes N is equipped to calculate the amount of changes N at any time.

Generally, since the amount of push-on M for maintaining the pressure in the outlet pipe 96 at a constant value increases at a predetermined speed, the above amount of changes N of the pump 120 is constant. However, if the discharge nozzle 85 is contaminated, then it causes hard discharging the resist solution. From this reason, in order to maintain the pressure in the outlet pipe 96 at a constant value, the pump controller 123 reduces a speed of the amount of push-on M of the pump 120. At this time, the aforementioned amount of changes N of the pump 120 varies. The varying signal is sent to the cleaning controller 124, and in turn the cleaning controller 124 instructs starting of the drive mechanism of the discharge nozzle 85 to move the discharge nozzle 85 to the cleaning position S. Thereafter, as explained above, the cleaning fluid is supplied form the supply flow path 94 and the cleaning of the discharging port 90b starts. Thus, by calculating and monitoring the amount of changes N at any time, it is possible to detect time of contamination, namely, the cleaning timing.

If the pump 120 is not a diaphragm type pump, but a rotary type pump by way of example, similarly, with monitoring the amount of changes of the rotational frequency of the pump, the amount of changes of power consumption, and so on, the changes or time at which an established threshold value is exceeded is set as the cleaning timing and thus the cleaning is performed.

The discharge nozzle 85 may be directly and visually monitored and the cleaning timing may be detected based on the image data. This is implemented by, for example, mounting a CCD camera or the like for monitoring the discharging port 90b of the discharge nozzle 90 to monitor it at any time.

In the foregoing embodiment, the resist solution has been discharged from above toward the wafer W. However, the present invention can be applied to the case where the resist solution is discharged from below toward the wafer W to form a resist layer. The resist solution has been coated in the manner of so-called the drawing in one stroke of a pen, but the present invention can be applied to another scheme, for example, the case of coating by a spin coating scheme in which the resist solution is coated while the wafer W is being rotated.

The foregoing embodiment is described about the film forming unit for coating the resist solution on the wafer W to form the resist layer. However, the present invention can be applied to another film forming unit for forming an insulation film or the like, for example, SOD, SOG film forming unit, and also still another film forming unit for a substrate other than the wafer W, for example, an LCD substrate.

Figure 10:
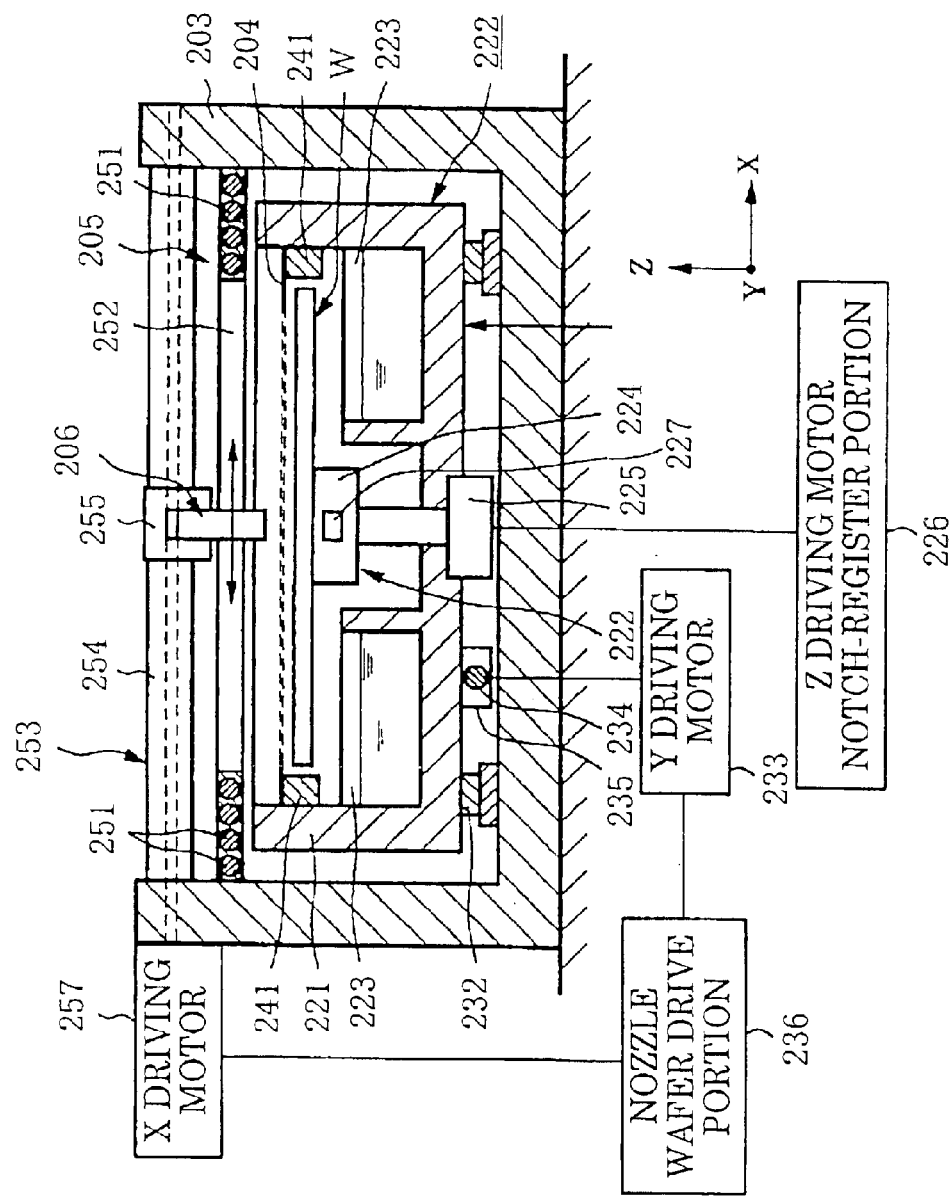
FIG. 10 is a sectional view illustrating an example of another embodiment according to the present invention.
Figure 11:
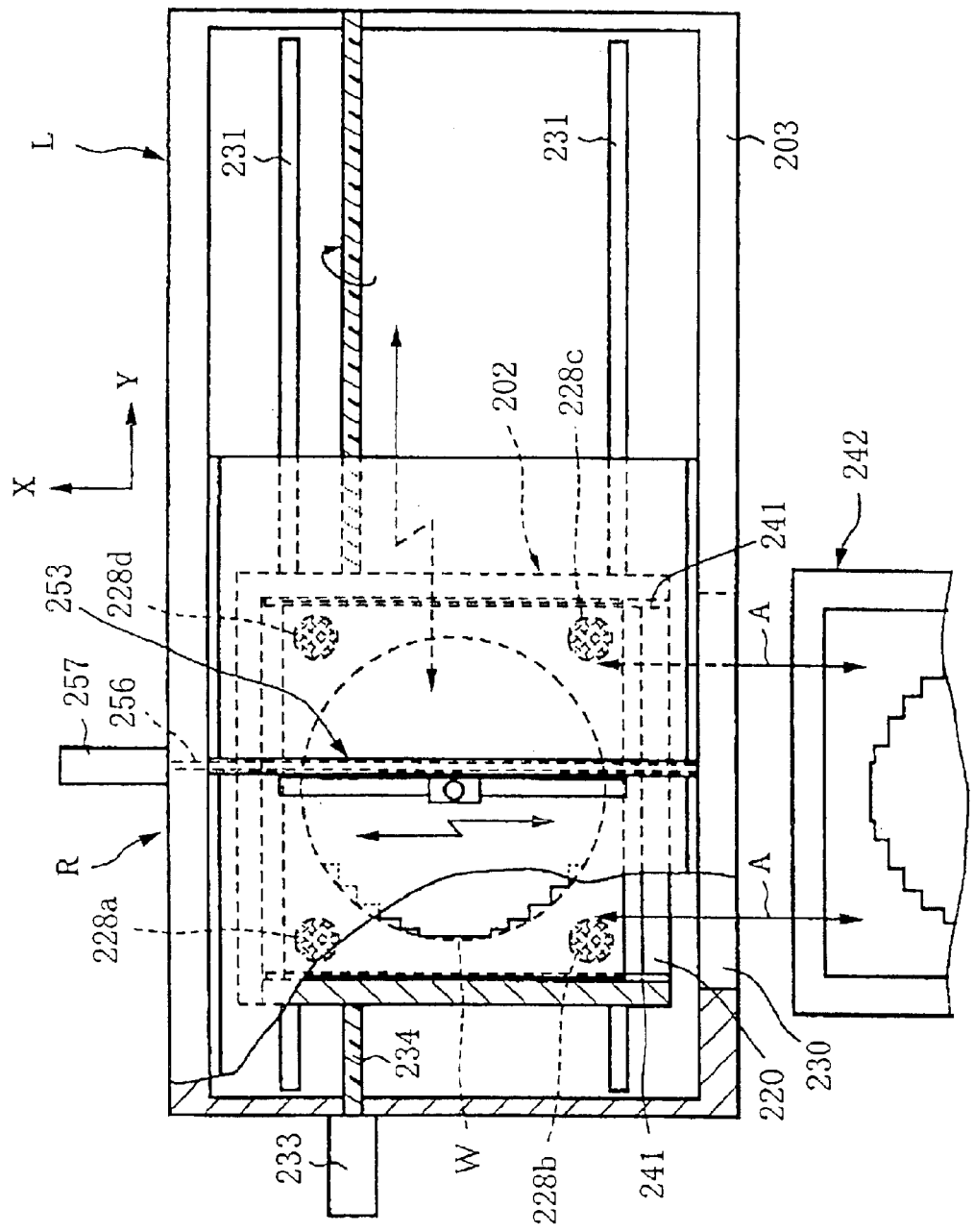
FIG. 11 is a plane view of a film forming unit of FIG. 10.

Still another embodiment will be described. FIG. 10 is a vertical sectional view illustrating configuration of an embodiment in which a film forming unit according to the present invention is applied to a resist solution coating unit for coating a resist solution on a semiconductor wafer (referred as "wafer" hereinafter) which is a substrate undergoing processing. FIG. 11 is a plane view thereof.

In FIG. 10 and FIG. 11, reference numeral 202 indicates a wafer holder as a substrate holding portion. The wafer holder 202 is held movably in a direction Y in a frame 203. The frame 203 is, for example, a member having an opened top and formed in a channel shape to be elongated in the direction Y An end of the frame 203 in the direction Y is configured as a resist solution coating section R for coating the resist solution and the other is configured as a wafer-load/unload portion L for loading/unloading the wafer W. The frame 203 includes a pair of Y rail 231 extending between the resist solution coating section R and the wafer-load/unload section L. The wafer holder 202 is held movable in the direction Y on the Y rails 231 via a Y slider 232. A Y driving motor 233 rotates a ball screw 234, whereby the wafer holder 202 is driven to allow positioning in the direction Y through a nut 235.

The wafer holder 202 has a main body 221 formed in a cap shape, and a wafer absorption table 222 for holding the wafer W. The main body 221 includes a solution storing channel 223 for storing solvent (a thinner solution) at a position facing the underside of the wafer W. The solution storing channel 223 is full of solvent of which liquid-temperature and liquid-level are controlled. The solvent is vaporized to maintain solvent atmosphere around the wafer in a predetermined concentration.

The wafer absorption table 222 includes a holding portion 224 for holding the wafer W on the top surface thereof. The holding portion 224 is connected to a not shown vacuum apparatus to vacuum catch the wafer W. The holding portion 224 is connected to a Zθ driving mechanism 225. When the wafer W holder 202 moves to the wafer-load/unload section L, a Z-positioning notch-register portion 226 actuate the Zθ driving mechanism 225 to cause a Z direction operation for loading/unloading the wafer W and a θ operation for the registration of notches. Moreover, the wafer absorption table 222 is connected to a not shown agitation generating portion, and secured thereto with an ultrasonic vibrator 227 for vibrating the absorption-held wafer W.

At four corners surrounding the above wafer absorption table 222 (wafer W) on the bottom surface of the main body 221, four forced-exhaust ports 228a to 228d are formed for controlling draft in the main body 221 and connected to a not shown exhaust system. Displacements from the respective forced-exhaust ports 228a to 228d are individually controlled. For example, a weak draft leaning to one side is produced in the main body 221 by performing exhausting from only two exhaust ports 228a, 228b. This allows controlling of a flow of solvent volatilized from the coated resist solution, resulting in suppression of extreme volatilization of the solvent.

Figure 12:
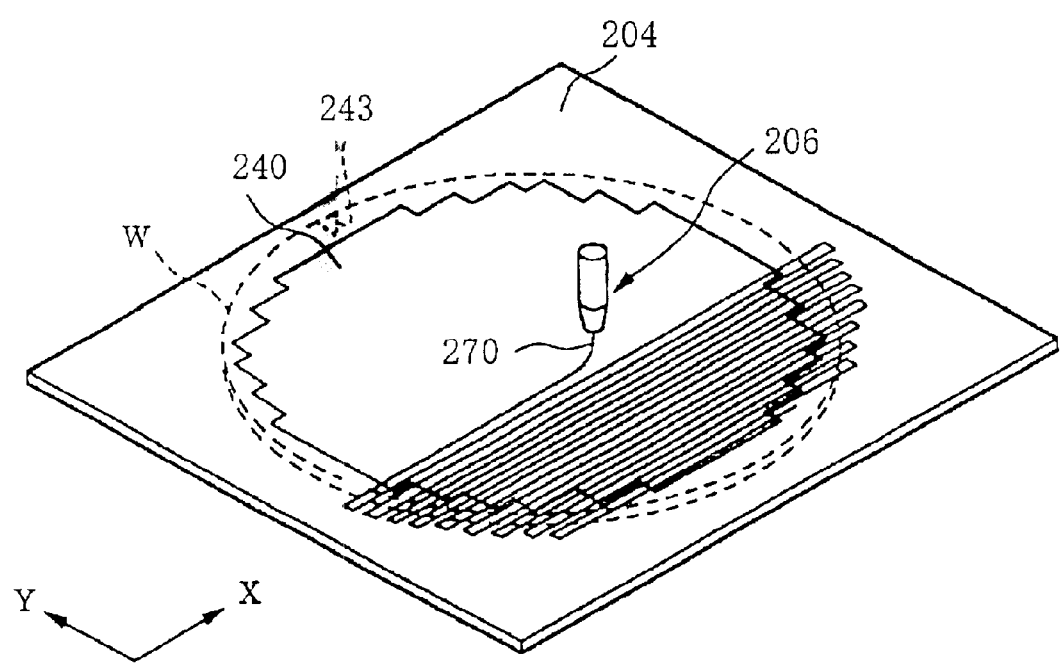
FIG. 12 is a perspective view for explaining a coating path of a resist solution.

In the wafer holder 202, a mask member drive mechanism 241 is provided in order to hold the mask member 204 immediately on the wafer W and drive the mask member 204 in a direction (direction X) indicated with an arrow A in FIG. 11 to pull out the mask member 204 from the inside of the wafer holder 202. As shown in FIG. 12, the mask member 204 covers the wafer W except for a circuit forming area 240 of the wafer W to prevent the circumferential edge portion of the wafer W from being coated with the resist solution. The above mask member drive mechanism 241 takes out the mask member 204, contaminated by the resist solution, from the resist coating unit via pulling-out paths 220, 230 provided in the wafer holder 202 and the frame 203 as indicated with the arrow A in FIG. 11, to carry it to the mask member cleaning unit 242. In FIG. 12, reference numeral 243 represents a notch formed in the wafer W.

In FIG. 10, reference numeral 205 represents a top plate with a thermostat function which is provided to the frame 203 to cover above of the wafer holder 202, and is configured to be embedded therein with, for example, a linear shaped heater 251 to heat at a predetermined temperature. Hence, the top plate 205 has a function of maintaining and controlling solvent atmosphere around the wafer W, and a function of heating a discharge nozzle 206, described later, to prevent the nozzle 206 from being clogged and the discharged resist-solution flow from "interruption".

The above top plate 205 is adapted to cover the wafer holder 202 only in the aforementioned resist solution coating section R in the extend to which the wafer holder 202 is continuously covered even when the wafer holder 202 is moved fully in the direction Y. In a middle portion of the top plate 205 in the direction Y, a slit 252 is formed for permitting the movement of the discharge nozzle 206 in the direction X. The slit 252 has a length corresponding to a width of the wafer W, and a width permitting the discharge nozzle 206 to pass through.

The discharge nozzle 206 is held by a linear slide mechanism 253 bridging between the top ends of the frame 203 along the direction X. the linear slide mechanism 253 is provided with a X rail 254, a slider 255 provided slidably on the X rail 254, a ball screw 256 for driving the slider 255, and a X drive motor 257 rotatably driving the ball screw 256. The discharge nozzle 206 is held at a position corresponding to the slit 252 of the top plate 205 by the above slider 255, and has a lower end extending through the slit 252 into the wafer holder 202. The X drive motor 257 and the Y drive motor 233 are designed to be operated in synchronization with each other by the nozzle wafer driving portion 236, to move the nozzle 206 with facing a predetermined route of the wafer W.

Figure 13:
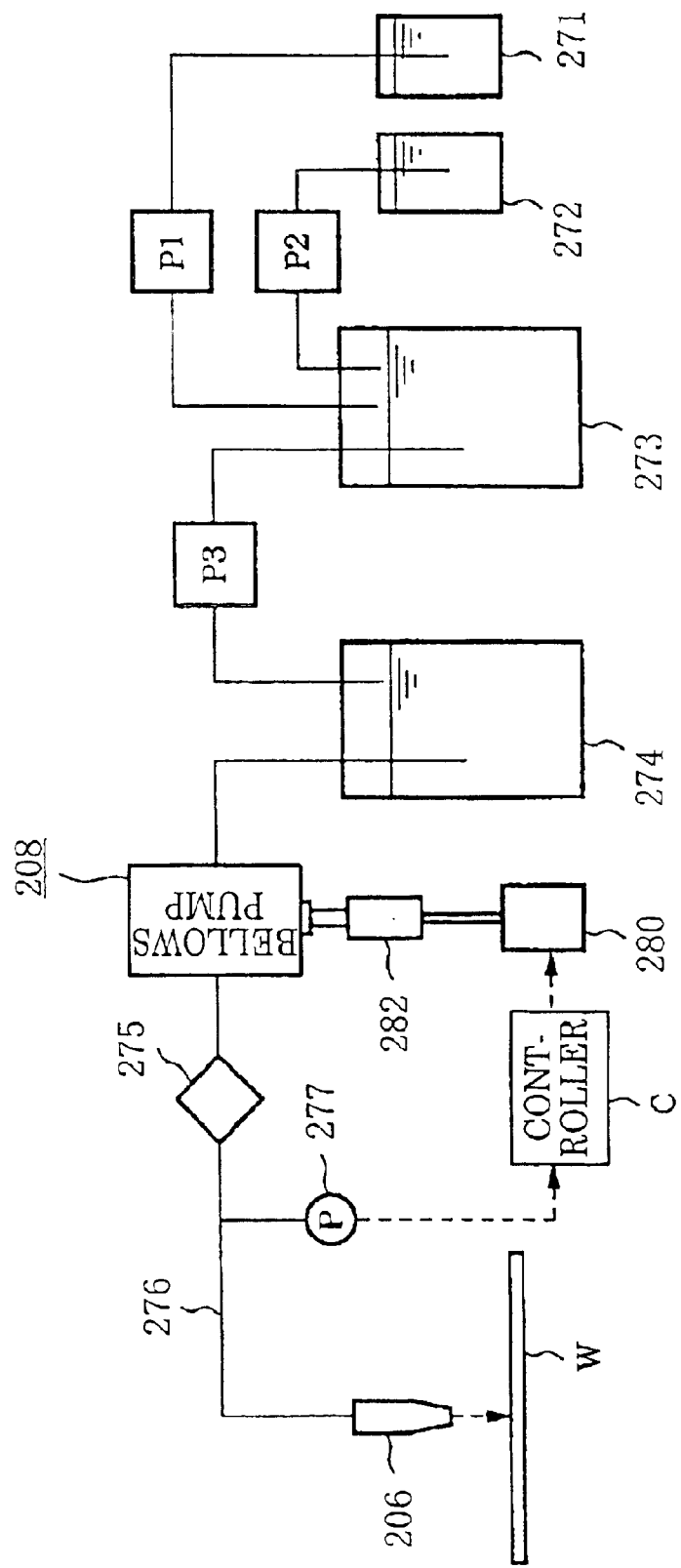
FIG. 13 is a block diagram for explaining a supply line of the resist solution.

Next, a supply line of the resist solution in the discharge nozzle 206 will be explained with reference to FIG. 13. In FIG. 13, reference numeral 271 represents a high-viscosity resist solution tank for storing, for example, a high-viscosity resist solution. Reference numeral 272 represents a solvent tank for storing solvent for the resist solution, for example a thinner solution. The high-viscosity resist solution in the high-viscosity resist solution tank 271 and the thinner solution in the solvent tank 272 are sent to a mixing tank 273 by the respective pumps P1 and P2, and then sent to a buffer tank 274 situated downstream from the mixing tank 273 by a pump P3.

The above mixing tank 273 is for mixing a predetermined quantity of high-viscosity resist solution and a predetermined quantity of thinner solution to prepare a resist solution having a predetermined viscosity, and includes a stirring mechanism. The resist solution in the buffer tank 274 is sent to the discharge nozzle 206 through a filter apparatus 275 by a push type pump, for example, bellows pump 208, and discharged from a discharging port 260, descried later, of the nozzle 206. These buffer tank 274, filter apparatus 275 and discharge nozzle 206 are connected by a supply flow path 276.

The present invention features in that the amount of press of a rod of the bellows pump 208 provided downstream from the buffer tank 274 is adjusted to thereby control the discharge pressure of the resist solution to be discharged from the discharge nozzle 206. The bellows pump 208 is first explained. For example, as shown in FIG. 14, the pump includes a flexible pipe 281, an air cylinder 282, and a solution-sending portion 283. The flexible pipe 281 is an extendable bellows made of a soft resin, has an end coupled with a flange 283a of the solution-sending portion 283 and the other end connected to a rod 282a of the air cylinder 282 as a press member through a flange 284a of a blind patch 284. The air cylinder 282 communicates with a compressed air supply source 280 controlled by a controller C.

The solution-sending portion 283 includes a solution store portion 285, and a pair of ball valve 286a, 286b respectively provided upstream and downstream from the solution store portion 285. The upstream ball valve 286a and the downstream ball valve 286b respectively includes hard balls 287a and 287b made of ceramic or the like, and stoppers 288a and 288b.

Figure 14A:
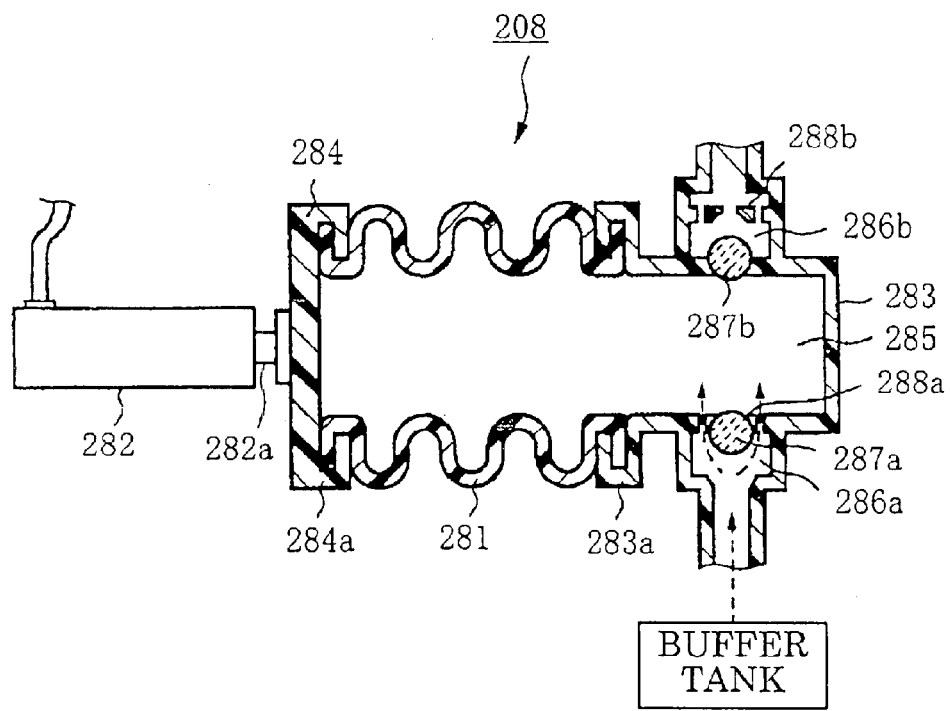
FIGS. 14(a) and 14(b) are sectional views for explaining a bellows pump.
Figure 14B:
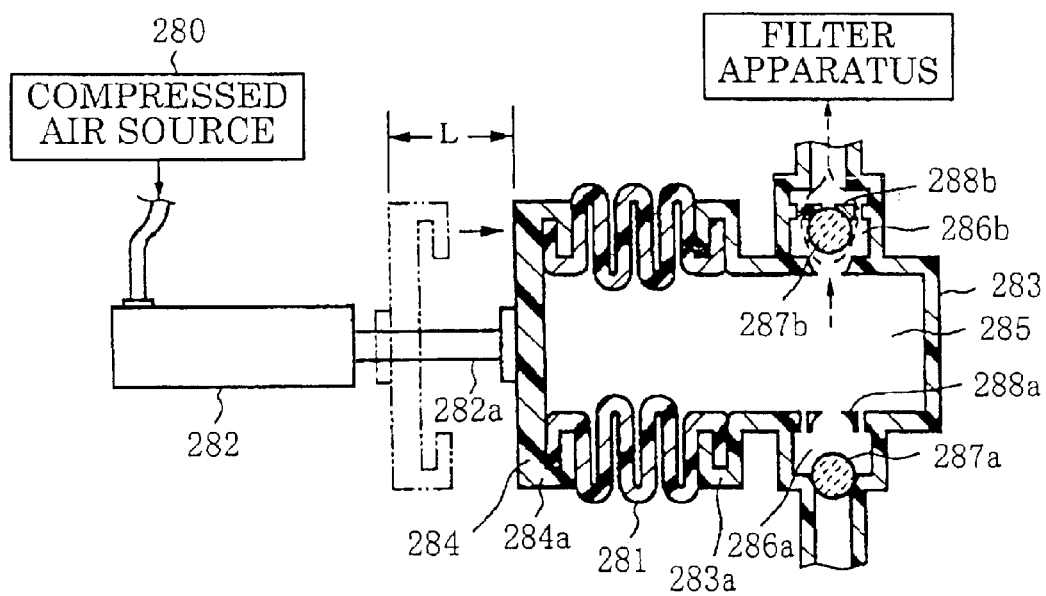

As shown in FIG. 14(a), when the rod 282a is pulled to extend the flexible pipe 281, the upstream ball valve 286a opens to suck a solution into the solution store portion 285. As shown in FIG. 14(b), when the rod 282a is pressed to contract the flexible pipe 281, the upstream ball valve 286a closes but the downstream ball valve 286b opens to push the solution out from the solution store portion 285 to the downstream. In other words, in this example, when the flexible pipe 281 extends, the resist solution flows into the solution store portion from the buffer tank 274. When the flexible pipe 281 is contrasted, the resist solution is sent toward the discharge nozzle 206.

The bellows pump 208 in the example, stores the resist solution in quantity larger than a quantity of resist solution required to coat five wafers W, in the flexible pipe 281 and the solution store portion 285. A quantity of resist solution sent out from the solution store portion 285 toward the downstream is controlled through the amount of stroke (the amount of press) L of the rod 282a of the air cylinder 282. In the example, the flexible pipe 281 and the solution store portion 285 correspond to a pipe body.

Figure 15:
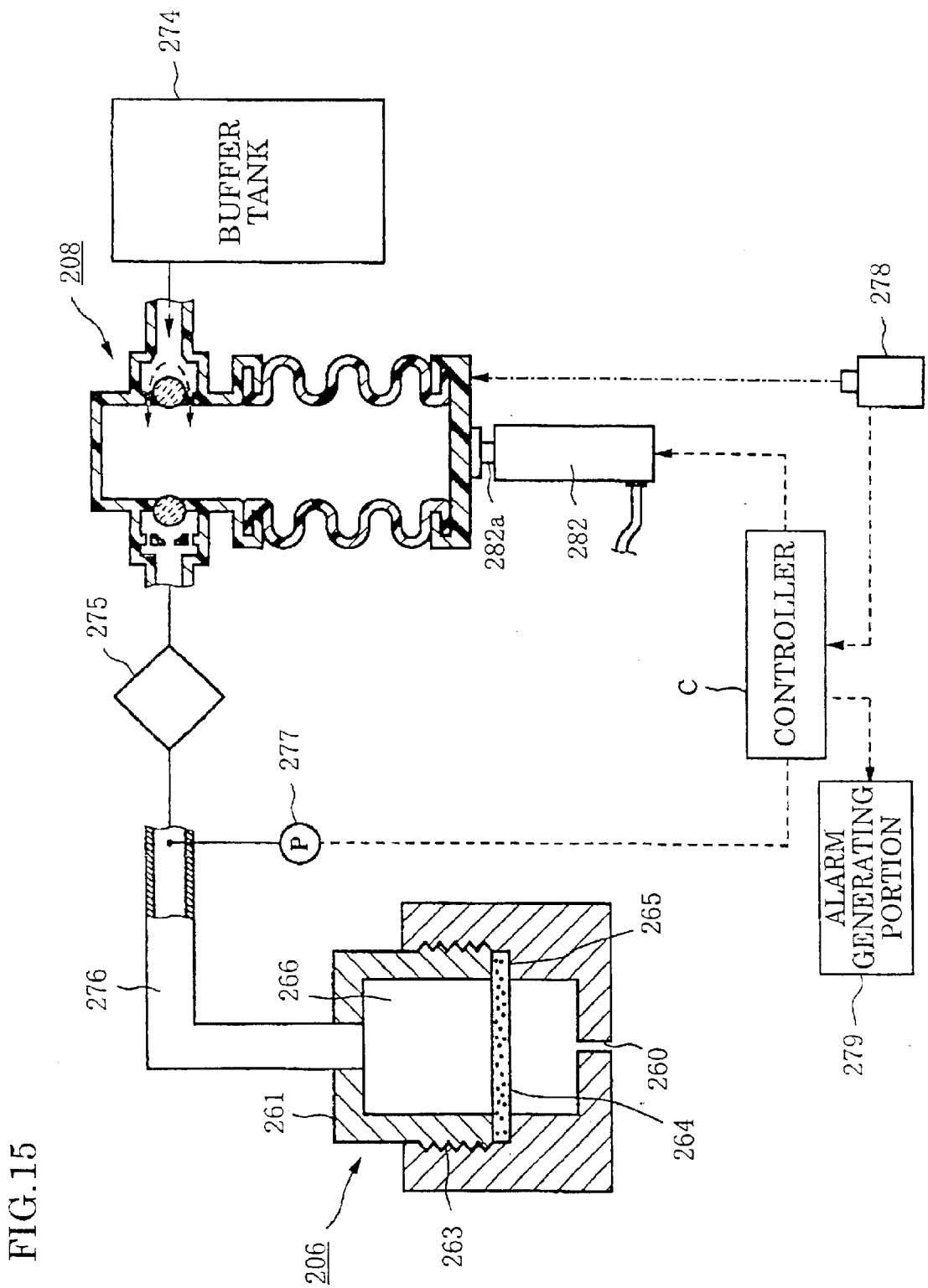
FIG. 15 is a sectional view for explaining the discharge nozzle.

Next, the discharge nozzle 206 is explained with reference to FIG. 15. The discharge nozzle 206 is designed to combine, for example, an upper member 261 which is tubular-shaped having a closed upper end and an opened lower end and made of, for example, polyethylene terephthalate (PTFE), and a lower member 262 which is tubular-shaped having an opened upper end and a closed lower end and made of PTEF. Screw cutting portions 263 are respectively formed at predetermined positions on the upper member 261 and the lower member 262, so that the lower member 262 is engaged with the upper member 261 from the exterior of the upper member 261.

The top surface of the upper member 261 is connected to an end of the supply flow path 276 for supplying the resist solution flowing from the filter apparatus 275 into the discharge nozzle 206. On the lower end of the upper member 261, a filter 264 consisting of, for example, an about 0.5 mm thick film made of resin, for example, PTEF, is formed to close an opening in the lower end.

Since the above PTEF film is a porous film having a lot of minute holes, it can be used as a filter 264. In the example, it is desirable to use a PTEF film having a hole diameter ranging, for example, from about 0.05 $\mu$m to about 10 $\mu$m, particularly, 5 $\mu$m. This hinders an air bubble having, e.g. an about 5 $\mu$m size included in the resist solution from passing through to allow penetration of only the resist solution as described later.

In the lower member 262, a step portion 265 is formed immediately under the position at which the screw cutting portion 63 is formed, corresponding to a configuration of the filer 264. The filter 264 is sandwiched and fixed between the lower end of the upper member 261 and the step portion 265 of the lower member 262. In the under face of the lower member 262, a discharging port 260 having a bore diameter ranging, for example, from about 10 $\mu$m to about 200 $\mu$m is formed for supplying the resist solution on the wafer W.

In this way, the resist solution supplied into the discharge nozzle 206 through the supply flow path 276, passes through a flow path 266 formed inside the upper member 261 and lower member 262, via the filter 264 arranged to cross the flow path 266, and is discharged through the discharging port 260 toward above of the wafer W.

In the example, for example, the pressure inside the supply flow path 276 between the filter apparatus 275 and the discharge nozzle 206 is detected by a pressure detector 277 of, for example, a diaphragm type distortion detecting scheme. Based on the detected value, the controller C adjusts the amount of press (the amount of stroke) L of the rod 282a of the air cylinder 282 of the bellows pump 208, through the compressed air source 280.

The amount of stroke L of the rod 282a of the air cylinder 282 is detected by, for example, a displacement gauge using light. The controller C controls operation of an alarm generating portion 279 based on the above detected value.

Operation of the above embodiment will be described below. First, the wafer holder 202 is placed on the wafer-load/unload section L. The holding portion 224 is moved upward to allow delivery of a wafer W from a not shown main arm for wafer carry onto the wafer absorption table 222, and the wafer W is absorbed and held thereon. Continuously, after the notch-register portion 226 performs registration of the notch in the wafer W, the holding portion 224 is moved downward to receive the wafer W to the inside of the wafer holder 202. The wafer holder 202 then moves to the resist solution coating section R, and the mask member drive mechanism 241 holds the mask member 204 above the wafer.

On the other hand, in the supply line of the resist solution, the resist solution (high-viscosity resist solution) having, for example, a viscosity of approximately 0.05 Pa·S stored in the high-viscosity resist solution tank 271, and the thinner solution stored in the solvent tank 272 are sent at respective quantities into the mixing tank 273 by the respective pump P1 and P2, and then mixed therein to prepare a resist solution (low-viscosity resist solution) having a predetermined viscosity, for example, a viscosity of approximately 0.003 Pa·S. The resulting resist solution in the mixing tank 273 is sent into the buffer tank 274 by the pump P3 to store it therein.

On the resist solution in the buffer tank 274, by pulling the rod 282a of the air cylinder 282 of the bellows pump 208 at a predetermined amount to extend the flexible pipe 281 to a predetermined length, the resist solution of a sufficient quantity to coat, for example, five wafers, is sent into the flexible pipe 281 and the solution store portion 285, and stored therein. Then, by pressing the rod 282a of the air cylinder 282 at a predetermined amount of press, the resist solution in the pump 208 is sent into the discharge nozzle 206 through the filer apparatus 275 to discharge it from the discharging port 260 of the discharge nozzle 206 toward the surface of the wafer W at a predetermined discharge pressure.

At this time, the pressure detector 277 detects pressure of the resist solution in the flow path 276 located between the filter apparatus 275 and the discharge nozzle 206 to maintain the discharge pressure of the resist solution, which is to be discharged from the discharging port 260 of the discharge nozzle 206, in a constant value during the discharging of the resist solution. Based on the detected value, the controller C controls the amount of press of the rod 82a of the aforementioned air cylinder 282.

Specifically, in the bellows pump 208, a length of the flexible pipe 281 is adjusted through the amount of press of the rod 282a of the air cylinder 282. This varies the discharge pressure (a quantity of solution) of the resist solution to be pushed out from the pump 208. For example, as the amount of press of the rod 282a increases to shorten the flexible pipe 281 in length, the discharge pressure of the resist solution to be discharged from the discharging port 260 of the discharge nozzle 206 toward the surface of the wafer W, increases. As the amount of press of rod 282a decreases, the discharge pressure of the resist solution decreases. The pressure in the aforementioned supply flow path 276 is proportional to the discharge pressure of the resist solution to be discharged from the discharge nozzle 206. When the pressure in the supply flow path 276 is large, the discharge pressure of the resist solution is larger; whereas when the pressure in the supply flow path 276 is small, the discharge pressure is smaller.

In consequence, the pressure of the resist solution in the supply flow path 276 is detected at predetermined timings, for example, every one second, and based on the detected value, the amount of air supplied from the compressed air supply source 280 to the air cylinder 282 is controlled so as to control the amount of press of the rod 282a, resulting in controlling the discharge pressure of the resist solution 270 from the discharging port 260 of the discharge nozzle 206 to maintain constant.

Moreover, in the example, the amount of stroke of the rod 282a of the air cylinder 282 is detected at predetermined timings, for example, every one second. When irregularities is found in the amount of stroke L based on the detected value, the controller C turns on the alarm generating portion 279 to indicate occurrence of irregularity.

Figure 16:
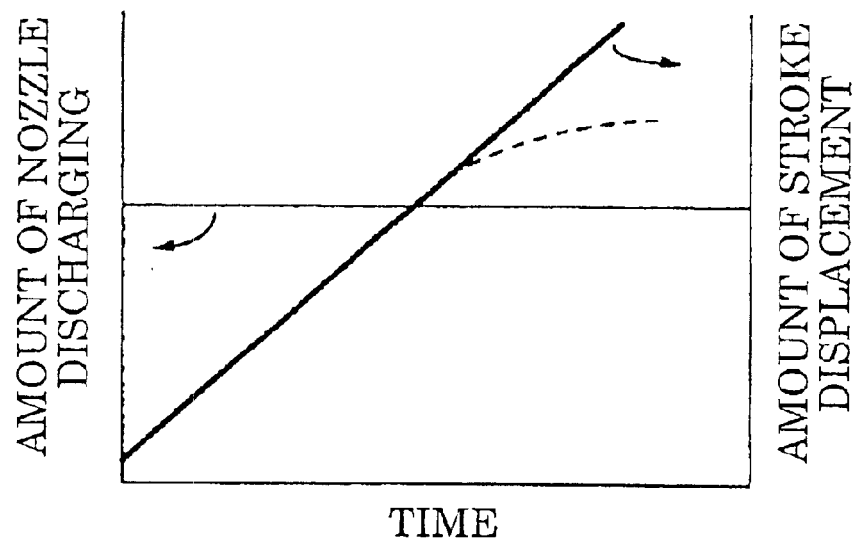
FIG. 16 is a graph showing changes of the amount of stroke of the bellows pump with respect to time, and changes of discharge pressure of the resist solution from the discharge nozzle with respect to time.
Figure 17:
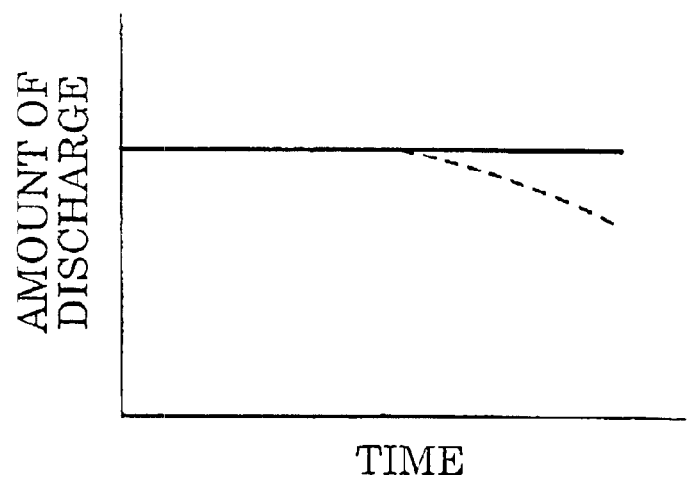
FIG. 17 is a graph showing changes of the volume of resist solution discharged from the discharge nozzle with respect to time.

As shown in FIG. 16, for example, to achieve a constant pressure, the amount of stroke displacement of the rod 282a of the air cylinder 282 is proportional to time. However, for example, if there are any irregularity such as clogging of the discharging port 260 of the discharge nozzle 206, the amount of stroke displacement departs from the proportional curve. In other words, in the case of the clogging of the discharging port 260, the discharging port 260 is blocked and thus the pressure in the supply flow path 276 increases. As indicated with the dotted line in FIG. 16, therefore, the amount of stroke displacement required for achieving the predetermined pressure may be less than a set value. Considering the relationship between the above and the amount of discharge, as shown in FIG. 17, when the discharge pressure of the nozzle is constant, the amount of discharge is also constant. When the nozzle is clogged, the amount of discharge decrease with time as indicated with the dotted line in FIG. 17.

In consequence, a reference range of changes of the amount of stroke displacement of the rod 282a of the air cylinder 282 with respect to time in order to achieve a constant discharge pressure is found in advance. Also, an actual amount of stroke L of the rod 282a of the air cylinder 282 is found at established periods of time by the displacement gauge 278. Comparing the found values, when the actual amount of stroke L is outside the set reference range of the amount of stroke, the controller C is designed to output an actuate signal to the alarm portion 279, thereby detecting occurrence of any irregularity, such as the clogging of the discharging port 260 of the discharge nozzle 206 or the like.

In this way, while the resist solution supplied into the discharge nozzle 206 through the supply flow path 276 is supplied toward the surface of the wafer W at an approximately constant discharge pressure, the discharge nozzle 206 and the wafer W are relatively moved based on the predetermined coating conditions, resulting in coating the resist solution. Specifically, as shown in FIG. 12, while the discharge nozzle 206 is sent intermittently at predetermined pitches in the direction Y, the discharge nozzle 206 is reciprocated in the direction X. While the discharge nozzle 206 is thus moved relative to the wafer W in a zigzag route, the resist solution 270 is discharged from the nozzle 206 toward the wafer W to form a uniform solution layer on the circuit forming area 20 of the wafer W.

The resist solution 270 discharged toward the wafer W and arrived there produces a certain spread in dependence on its viscosity. Therefore, when appropriate feed pitch in the direction Y is set in accordance with the amount of spread, it is possible to form a uniform resist layer on the entire circuit forming area 240 of the wafer W.

After coating the resist solution, the ultrasonic vibrator 227 mounted on the wafer absorption table 222 is actuated to apply vibration to the wafer W at a ultrasonic band. This adds agitation to the coated resist solution layer to flatten the surface of the solution layer.

After that the mask member 4 adhered with the resist solution 270 is moved toward the mask member cleaning unit 42, then the wafer holder 2 is moved from the resist solution coating section R to the wafer load/unload section L. Thereafter, the holding portion 24 is moved up to deliver the wafer W to the not shown main arm and unload the wafer W from the resist solution coating unit.

In the film forming unit of the present invention as described above, the resist solution 270 can be discharged from the discharge nozzle 206 toward the wafer W at the constant discharge pressure (the amount of discharge). Therefore, the resist solution 270 is not interrupted on the wafer W and can be continuously discharged with a constant line width. For this reason, a quantity of the resist solution 270 supplied on the wafer W is substantially equal across the entire face of the circuit forming area 240 of the wafer W, which improves inplane uniformity of a film thickness of the resist layer. In this point, since a diameter of the discharging port 260 of the discharge nozzle 206 is formed as an extremely small diameter ranging from about 10 μm to 200 μm, it is possible to form a resist layer having a thin film thickness and a high uniformity of film thickness.

Since the alarm indicates occurrence of irregularities, irregularities can be detected at an early stage and addressed quickly. In the example, the resist solution 270 is mixed with the thinner solution. As described above, the discharging port 260 of the discharge nozzle 206 is formed to have an extremely small diameter. For these reasons, the thinner solution volatilizes and the clogging tends to be created. Therefore, for example, if an irregularity is the clogging of the discharge nozzle 206, it is possible to find the clogging at an early stage, resolve the clogging, and then restart continuously discharging the resist solution 270 from the discharge nozzle 206 toward the wafer W with a constant line width.

If detecting such irregularity delays, the resist solution 270 will be supplied from the clogged discharge nozzle 206 toward the wafer W, which make it impossible to discharge the resist solution 270 toward the wafer W at the constant discharge pressure. This reduces the inplane uniformity of a film thickness of the resist layer and throughput of the coating processing of the resist solution.

Since the clogging at a earlier stage can be resolved without cleaning of the discharge nozzle 206 or with simple cleaning, the number of cleaning the nozzle 206 or a total cleaning time period can be reduced. This also improves throughput.

In the example, since the filter 264 consisting of the PTEF film is provided to cross the flow path 266 of the discharge nozzle 206, the resist solution 270 can be further stably supplied from the nozzle 206 to the wafer W. Specifically, air bubbles having an about 5 $\mu$m size may occur in the resist solution 270 due to changes in pressure of an already-dissolved gas by bending of the pipe, or the like. If such air bubbles are in existence around the discharging port 260 of the discharge nozzle 206, the air bubbles serves as cushion to reduce the discharge pressure of the resist solution, or the discharge pressure temporarily increases when the air bubbles burst and disappears, resulting in variance of the discharge pressure of the resist solution.

With providing the filter 264, since the air bubbles can be removed from the resist solution 270 by the filter 264, the variance in the discharge pressure of the resist solution 270 caused by the air bubbles is suppressed, which allows stable supply of the resist solution. In this point, since the example employs the PTEF film having a hole diameter of about 5 $\mu$m, a loss of pressure is suppressed.

In the above example, in the supply line of the resist solution, since the high-viscosity resist solution is diluted in the mixing tank with the thinner solution, use of a high-viscosity resist solution which is impossible conventionally is practicable. This eliminates limitation of viscosity of a resist solution used, resulting in improvement of general-purpose properties of the coating method.

The resist solution 270 after its viscosity is adjusted in the mixing tank 273 is sent temporarily into the buffer tank 274, and then supplied therefrom to the discharge nozzle 206 by the bellows pump 208 having a control line for a press force. This facilitates control. Specifically, when chemicals are respectively supplied directly from the high viscosity resist solution tank 271 and the solvent tank 272 into the discharge nozzle 206 without using the mixing tank 273 and the buffer tank 274, the pump P1, P2 are needed to include the respective control lines of the pressing force. In this event, the pump P1 and P2 must be synchronized with each other, resulting in a complicated control.

Figure 18:
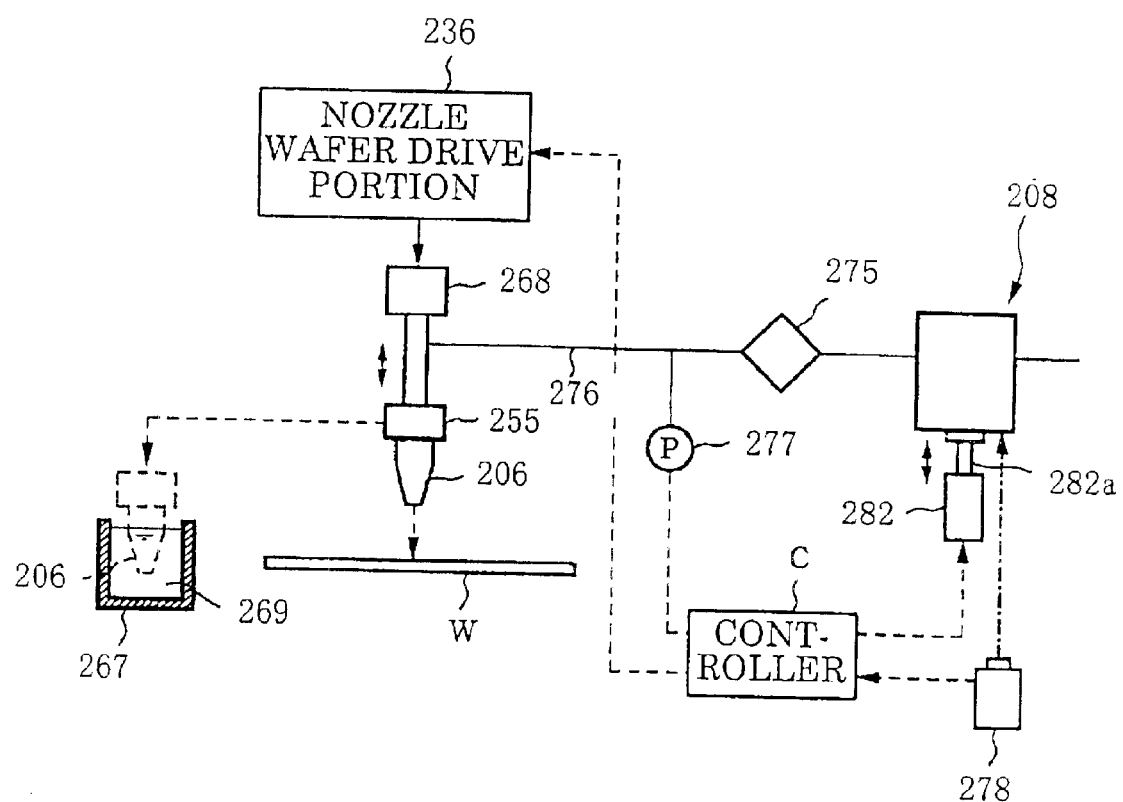
FIG. 18 is a block diagram illustrating another example of a supply line of a resist solution.

Next, another example of the present invention will be explained with reference to FIG. 18. This example is for a system in which irregularities in stroke of the rod 282a of the air cylinder 282 of the bellows pump 208 is detected, and the discharge nozzle 206 is cleaned when an irregular vale is detected. For example, in the example, a cleaning portion 267 for cleaning the discharge nozzle 206 is provided in the wafer load/unload section L, and the slider 255 holding the discharge nozzle 206 is moved up and down by a hoisting and lowering mechanism 268. The cleaning portion 291, for example, dips the discharge nozzle 206 into cleaning fluid 269 for a predetermined period of time. A nozzle wafer drive portion 236 controls operation of the hoisting and lowering mechanism 268

The amount of stroke L of the rod 282a of the air cylinder 282 is detected at predetermined timings, for example, every one second by the displacement gauge 278. When the amount of stroke L goes out of the preset reference range based on the detected value, the controller C controls the nozzle wafer drive portion 236 to move the discharge nozzle 206 to the cleaning portion 267 for cleaning of the discharge nozzle 206.

In such example, since the discharge nozzle 206 is automatically cleaned, even when any irregularities such as the clogging occur, the irregularity can be resolved smoothly without putting any burden on an operator.

Figure 19:
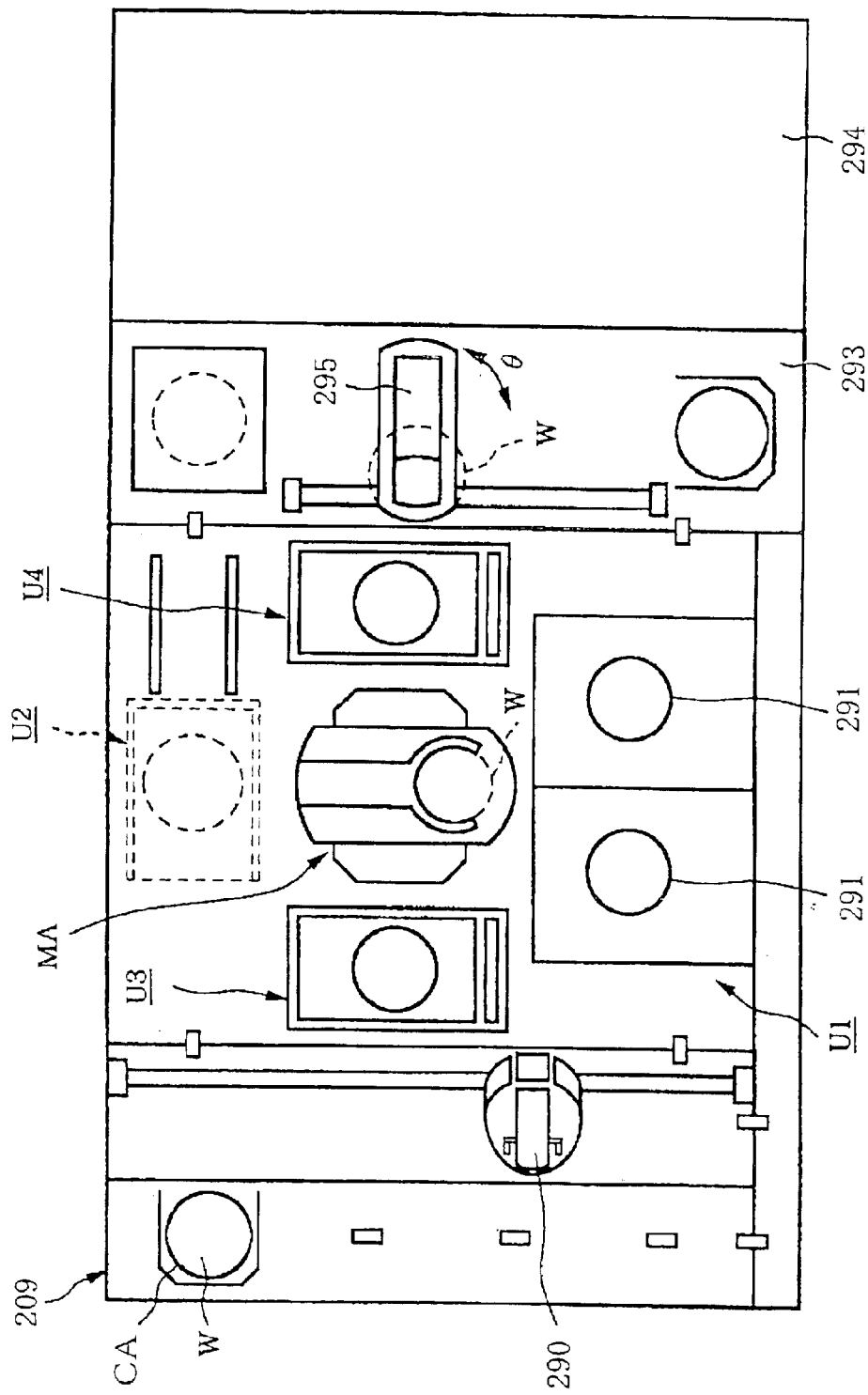
FIG. 19 is a plane view illustrating a coating and developing system having a film forming unit of an embodiment.
Figure 20:
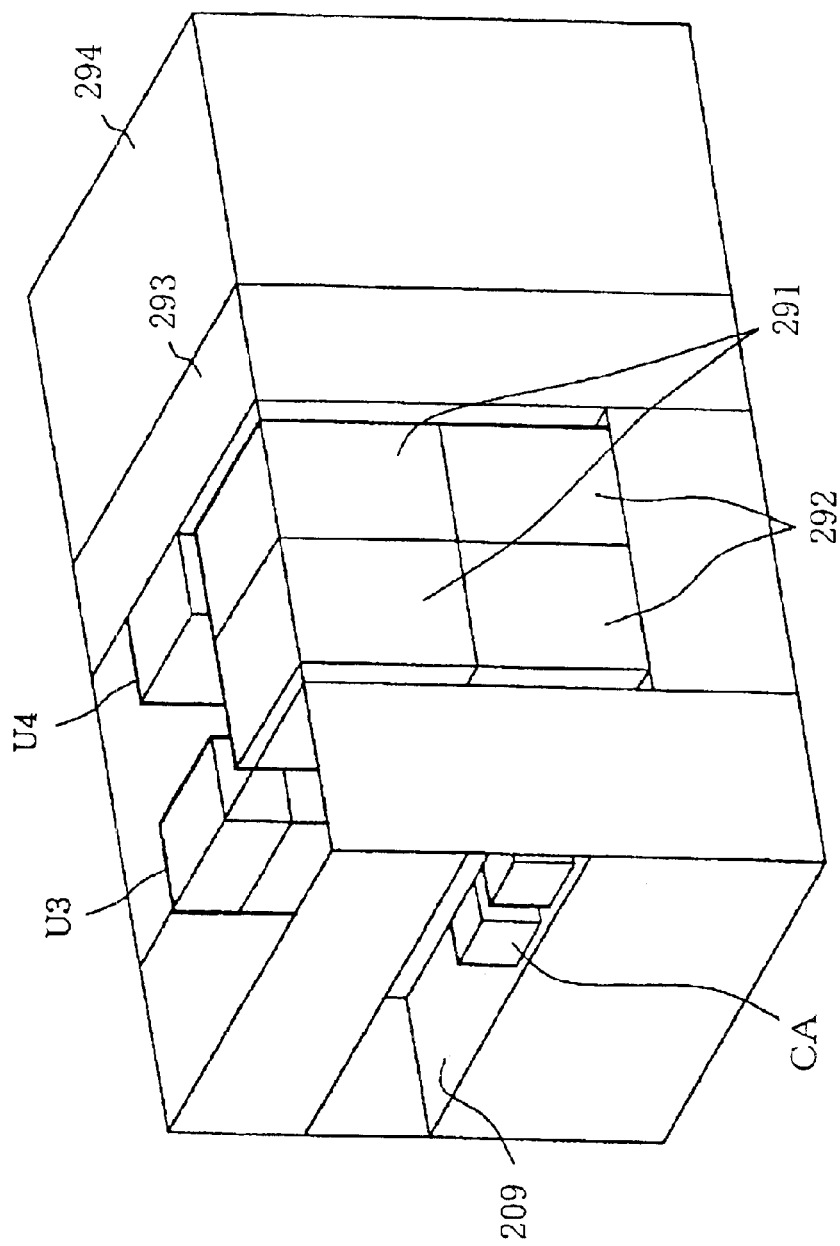
FIG. 20 is a perspective view illustrating external of the coating and developing system in FIG. 19.
Figure 21:
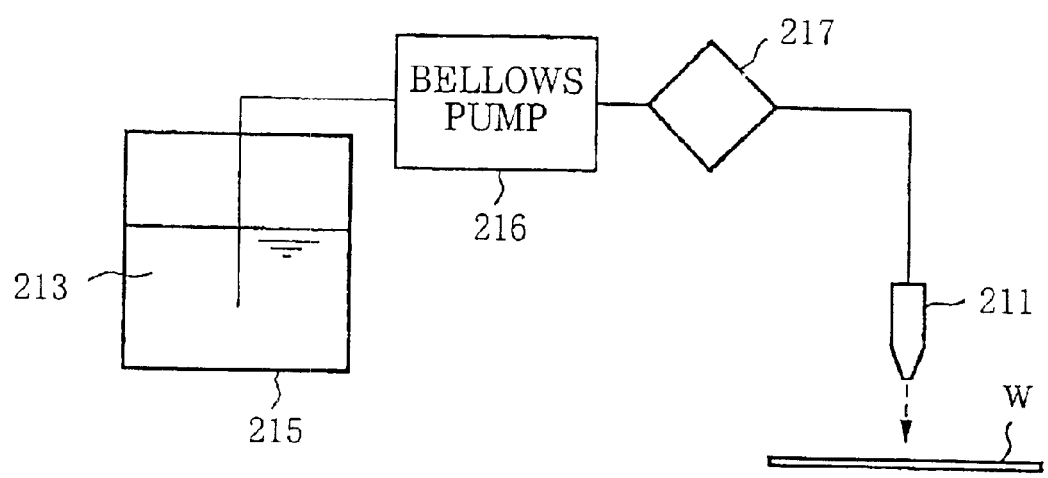
FIG. 21 is a block diagram illustrating a conventional supply line of a resist solution.

Next, an example of a coating and developing system incorporating the aforementioned developing unit will be outlined with reference to FIG. 19 and FIG. 20. In FIG. 19 and FIG. 20, reference numeral 209 represents a delivery stage for giving and capturing a wafer cassette, on which a cassette CA housing wafers, e.g. 25 wafers, is mounted by, for example, an automatic carry robot. A delivery arm 290 for the wafer W is provided rotatably at an angle of $\theta$ in the directions X, Y (rotation about a vertical axis) in an area facing the delivery state 209. On the back side of the delivery arm 290, for example, on the right side seeing from the delivery stage 290 toward the back, a unit U1 of a coating and developing block, and similarly, on the left side, on the front side, and on the back side seeing therefrom, units U2, U3 and U4 of a heating and cooling block are arranged, respectively. Furthermore, for example, a wafer carry arm MA is provided to be movable in the up, down, left, right, front and back directions, and rotatable about the vertical axis in order to deliver the wafer W between the unit of the coating and developing block and the units of the heating and cooling block. In FIG. 20, the unit U2 and the wafer carry aim are not described for easier understanding.

In the unit of the coating and developing block, for example, two developing units 291 are situated in the upper level, and two coating units 292 having the aforementioned film forming unit are situated in the lower level. In the units of the heating and cooling block, a heating unit, cooling unit, hydrophobic treatment unit, and so on are arranged in the upper and lower levels.

The above part including the coating and developing block unit and the heating and cooling block unit refers as "clean-track". On the back side of the clean-track, an aligner 294 is connected through an interface unit 293. The interface unit 293 is provided for delivering the wafer W between the clean-track and the aligner 294 using, for example, a wafer carry arm 295 which is designed to be movable in the up, down, left, right, front and back directions, and rotatable about the vertical axis.

Explaining the flow of the wafer in the system, first, a cassette CA housing wafers W is delivered from the outside to the deliver stage 209. The wafer carry arm 290 takes out the wafer W from the cassette CA, and delivers them to the wafer carry arm MA via a deliver table which is one of shelves of the aforementioned heating and cooling unit U3.

Then, the hydrophobic processing is performed in a processing portion of a shelf in the unit U3, thereafter the resist solution is coated in the coating unit 292 to form a resist layer. The wafer W coated with the resist layer is heated in the heating unit, then sent through the interface unit 293 to the aligner 294 to be exposed through a mask corresponding to a pattern.

After that, the wafer W is heated in the heating unit, cooled in the cooling unit, and then sent to the developing unit 291 for the developing treatment to form a resist mask. Then, the wafer W is returned to the cassette CA placed on the deliver stage 209.

In the present invention as described above, a configuration in which the amount of press of the bellows pump is controlled based on the pressure in the supply flow path 276 located between the bellows pump 208 and the discharge nozzle 206 to control the amount of discharge of the resist solution to be discharged from the discharge nozzle 206 toward the surface of the wafer W; a configuration in which the alarm generating portion 279 is actuated when the amount of press of the bellows pump 208 goes out of from the preset reference range; a configuration in which the discharge nozzle 206 is cleaned when the amount of press of the bellows pump 208 goes out of from the preset reference range; and a configuration of use of the discharge nozzle 206 including the filter 274 for removing air bubbles from the resist solution, may be used in combination or alone.

On the supply line of the resist solution, instead of the mixing tank 273 diluting the high-viscosity resist solution with the thinner solution, an inline mixer, so called a static mixer, may be provided for mixing the high-viscosity resist solution and the thinner solution to prepare a low-viscosity resist solution having a predetermined viscosity. The inline mixer is for forming a turning flow path in pipe arrangement by providing the alternating arrangement of a twisted plate turned rightward at a right angle and a twisted plate turned leftward at a right angle in the pipe arrangement. Upon sending a predetermined quantity of the high-viscosity resist solution and a predetermined quantity of the thinner solution to the above turning flow path, the solutions are agitation-mixed while flowing in the above flow path, resulting in preparing a low-viscosity resist solution having a predetermined viscosity. In this way, when the inline mixer is provided instead of the mixing tank 273, the pump for sending the low-viscosity resist solution from the mixing tank 273 to the buffer tank 274 can be omitted, resulting in reduction in size of the system and costs.

Moreover, the mixing tank 273 diluting the high-viscosity resist solution with the thinner solution may be not provided on the supply line of the resist solution. Instead, the low-viscosity resist solution may be supplied directly to the discharge nozzle 206 using the bellows pump 208 performing the control for the press force. Alternatively, the buffer tank 274 may be omitted. Instead, the low-viscosity resist solution may be supplied directly to the discharge nozzle 206 from the mixing tank 274 using the bellows pump 208 performing the control for the press force. In these cases, for example, after a predetermined quantity of the high-viscosity resist solution and the thinner solution are supplied to the mixing tank 273 and the resist solution of a predetermined viscosity is prepared, while the sending of the high-viscosity resist solution and the thinner solution can be stopped, a resist solution may be sent downstream by the bellows pump 208.

Further, the high-viscosity resist solution and the solvent may be supplied directly to the discharge nozzle 206 using the bellows pumps controlling the respective press forces. In this case, the bellows pumps are respectively controlled while being synchronized.

Further, the press type pump performing the control of press force according to the present invention is not limited to the bellows pump. For example, a diaphragm pump, a rotary type pump and so on may be used. The press member is not limited the air cylinder. The rod may be pressed through a motor or the like.

Still further, in the invention, instead of the filter apparatus 275 provided between the bellows pump 208 and the discharge nozzle 206, the filter apparatus 275 may be designed to provide it between the buffer tank 274 and the bellows pump 208. In this case, since bubbles occurring in the buffer tank 274 can be removed by the filter apparatus 275, the buffer tank 208 is prevented from entry of the bubbles and it is effective.

Yet further, in the aforementioned embodiment has explained an example of use of the resist solution as a processing fluid, but the resist solution is not limited. For example, the present invention can be applied to layer insulation film materials, high conductive materials, low dielectric materials, ferroelectric materials, wiring materials, organometallic materials, a metal paste such as a silver paste, and so on. The filter 274 provided in the discharge nozzle is not limited to the PTEF film. For example, resin such as nylon can be used. The substrate is not limited to the semiconductor wafer. The substrate may be an LCD substrate, an exposure mask, and so on. The discharge nozzle 206 and the wafer W should be relatively moved, so that for example, the discharged nozzle 206 may be fixed while the wafer W may be driven in the directions X and Y. The drive mechanism for the discharge nozzle 206 or the wafer holder 202 is not limited to the aforementioned examples. For example, a belt drive mechanism may be used. Here, through the present invention, "approximately horizon" means that an approximately horizontal state is included.

According to the present invention, since the amount of press of the press member of the press type pump is controlled based on the pressure in the flow path for the processing fluid between the press type pump and the discharge nozzle, the amount of discharge of the processing fluid remains invariant during the processing, resulting in forming a solution layer having a stable film thickness. According to the present invention, irregularities such as the clogging of the discharge nozzle can be detected at an early stage. When the irregularity such as the clogging of the discharge occur, the discharge nozzle can be quickly cleaned without putting any burden on an operator.

According to the present invention, variation in discharge pressure of the processing fluid which is caused by the presence of air bubbles included in the processing fluid and the like are suppressed. This allows the stable supply of the processing fluid for the substrate, resulting in improving uniformity of a film thickness of a solution layer.

What is claimed is:

1. A film forming unit for discharging a coating solution from a coating solution discharge nozzle toward a substrate to form a layer on a surface of the substrate, comprising:
 a press type pump including a pump body for sending said coating solution to said coating solution discharge nozzle, and a press member for pressing the pump body, the coating solution being sent into the pump body from the upstream by pulling the press member, the coating solution being sent from the pump body toward the downstream by pressing the press member, the amount of coating solution sent toward the downstream being adjusted by the amount of press of the press member, a pressure detector for detecting pressure in a flow path for the coating solution between said press type pump and said coating solution discharge nozzle; and a pressure controller for controlling the amount of press of the press member of said press type pump based on a detected value from said pressure detector;

the amount of press of the press member of said press type pump being controlled based on the pressure in the flow path for the coating solution between said press type pump and said coating solution discharge nozzle, to control the amount of discharge of the coating solution to be supplied from said coating solution discharge nozzle toward the surface of the substrate;

a transferring mechanism for transferring said coating solution discharge nozzle with respect to the substrate; and a transferring controller for controlling said transferring mechanism so as to move said nozzle along a continuous path being able o cover a surface of the substrate.

2. A film forming unit according to claim 1, wherein a flow path for flowing the coating solution to be discharged; and a filter provided in the flow path for removing air bubbles from the coating solution.

3. A film forming unit as set forth in claim 2, wherein said filter is made of a porous resin.

4. A film forming unit as set forth in claim 1, further comprising:

a substrate holding portion for horizontally holding said substrate, while said substrate holding portion and said coating solution discharge nozzle are relatively driven along the plane direction of the substrate, the coating solution being discharged from the coating solution discharge nozzle to form a solution layer of the coating solution on a surface of the substrate.

5. A film forming unit as set forth in claim 1, further comprising:

a mixing tank for mixing a coating solution of a high viscosity and solvent for the coating solution to prepare a coating solution of a low viscosity, the coating solution prepared in viscosity in the mixing tank being sent to the coating solution discharge nozzle by said press type pump.

6. A film forming unit as set forth in claim 1, wherein said coating solution is a resist solution.

7. A film forming unit as set forth in claim 1, further comprising:

a mask member being positioned above the surface of the substrate and defining an area to be covered with the coating solution.

8. A film forming unit as set forth in claim 1, wherein the transferring mechanism including a nozzle conveyor for transferring the nozzle in a x-direction and a substrate in a y-direction perpendicular to the x-direction.

9. A film forming unit for discharging a coating solution from a coating solution discharge nozzle toward a substrate to form a layer on a surface of the substrate, comprising;

a press type pump including a pump body and a press member for sending said coating solution to said coating solution discharge nozzle, the coating solution being sent into the pump body from the upstream by pulling the press member, the coating solution being sent from the pump body toward the downstream by pressing the press member, the amount of coating solution sent toward the downstream being adjusted by the amount of press of the press member, a displacement gauge for detecting the amount of press of the press member of said press type pump; and a controller for controlling operation of an alarm generating portion based on a detected value from said displacement gauge, said alarm generating portion being operated when the amount of press of the press member of said press type pump goes out of a preset reference range.

10. A film forming unit for discharging a coating solution from a coating solution discharge nozzle toward a substrate to form a layer on a surface of the substrate, comprising:

a press type pump including a pump body and a press member for sending said coating solution to said coating solution discharge nozzle, the coating solution being sent into the pump body from the upstream by pulling the press member, the coating solution being sent from the pump body toward the downstream by pressing the press member, the amount of coating solution sent toward the downstream being adjusted by the amount of press of the press member, a displacement gauge for detecting the amount of press of the press member of said press type pump;

a cleaning portion for cleaning said coating solution discharge nozzle;

a drive mechanism for moving said coating solution discharge nozzle to said cleaning portion; and a controller for controlling operation of said drive mechanism based on a detected value from said displacement gauge, said coating solution discharge nozzle being moved to the cleaning portion by said drive mechanism for cleaning of the coating solution discharge nozzle when the amount of press of the press member of said press type pump goes out of a preset reference range.

* * * * *